United States Patent
Lapierre et al.

(10) Patent No.: US 10,735,109 B1
(45) Date of Patent: Aug. 4, 2020

(54) AUTOMATED ANALYSIS OF RF SPECTRUM

(71) Applicant: EXFO Inc., Quebec (CA)

(72) Inventors: Dominic Lapierre, Rigaud (CA); Luc Germain, Candiac (CA); Robert Matesevac, Wake Forest, NC (US)

(73) Assignee: EXFO Inc., Québec (CA)

( * ) Notice: Subject to any disclaimer, the term of this patent is extended or adjusted under 35 U.S.C. 154(b) by 0 days.

(21) Appl. No.: 16/739,812

(22) Filed: Jan. 10, 2020

Related U.S. Application Data

(60) Provisional application No. 62/861,544, filed on Jun. 14, 2019, provisional application No. 62/791,202, filed on Jan. 11, 2019, provisional application No. 62/819,731, filed on Mar. 18, 2019.

(51) Int. Cl.
| | |
|---|---|
| *H04W 24/00* | (2009.01) |
| *H04B 15/04* | (2006.01) |
| *H04L 12/26* | (2006.01) |
| *G01R 23/16* | (2006.01) |
| *H04B 17/30* | (2015.01) |
| *H04W 24/02* | (2009.01) |

(52) U.S. Cl.
CPC ............ *H04B 15/04* (2013.01); *G01R 23/16* (2013.01); *H04B 17/30* (2015.01); *H04L 43/50* (2013.01); *H04W 24/02* (2013.01)

(58) Field of Classification Search
CPC ....... H04W 4/80; H04W 88/06; H04W 40/28; H04W 4/029; H04W 4/70; H04W 56/0015; H04W 16/28; H04W 28/18; H04W 36/0061
See application file for complete search history.

(56) References Cited

U.S. PATENT DOCUMENTS

| | | |
|---|---|---|
| 6,373,909 B2 | 4/2002 | Lindquist et al. |
| 6,622,044 B2 | 9/2003 | Bange et al. |
| 7,024,680 B2 | 4/2006 | Howard |
| 7,106,781 B2 | 9/2006 | Agee et al. |
| 7,133,686 B2 | 11/2006 | Hundal et al. |
| 7,269,151 B2 | 9/2007 | Diener et al. |
| 7,457,295 B2 | 11/2008 | Saunders et al. |
| 7,656,897 B2 | 2/2010 | Liu |

(Continued)

FOREIGN PATENT DOCUMENTS

EP   3 035 063 A1   12/2014

OTHER PUBLICATIONS

Brian Weeden, Radio Frequency Spectrum, Interference and Satellites Fact Sheet, Secure World Foundation, Jun. 25, 2013.

(Continued)

*Primary Examiner* — Khalid W Shaheed
(74) *Attorney, Agent, or Firm* — Clements Bernard Walker; Lawrence A. Baratta, Jr.

(57) ABSTRACT

Systems and methods e to automatically analyze and display results of tests of a link include obtaining data from one or more tests of a link, wherein the data includes samples for Antenna Carriers (AxC) for one or more AxCs auto-detected on the link; processing the data to detect peaks on any of the auto-detected AxCs on the link; performing an analysis of any detected peaks to identify any issues on the link; and causing display of a user interface that includes a reporting of any identified issues with the user interface including a display of the identified issues and a spectrum graph.

22 Claims, 27 Drawing Sheets

(56) References Cited

U.S. PATENT DOCUMENTS

| | | |
|---|---|---|
| 7,822,105 B2 | 10/2010 | Underbrink et al. |
| 7,860,193 B2 | 12/2010 | Gupta |
| 7,986,922 B2 | 7/2011 | Glazko et al. |
| 8,027,643 B2 | 9/2011 | Osterling et al. |
| 8,144,824 B2 | 3/2012 | Vrcelj et al. |
| 8,295,380 B2 | 10/2012 | Zhu et al. |
| 8,320,433 B2 | 11/2012 | Wegener |
| 8,649,388 B2 | 2/2014 | Evans et al. |
| 8,694,306 B1 | 4/2014 | Short et al. |
| 9,014,052 B2 | 4/2015 | Gravely et al. |
| 9,071,343 B2 | 6/2015 | Abdelmonem |
| 9,083,567 B2 | 7/2015 | Shi et al. |
| 9,125,054 B2 | 9/2015 | Ryan |
| 9,276,605 B2 | 3/2016 | Xia et al. |
| 9,277,424 B2 | 3/2016 | Garcia |
| 9,288,683 B2 | 3/2016 | Garcia et al. |
| 9,385,780 B2 | 7/2016 | Alloin et al. |
| 9,941,959 B2 | 4/2018 | Heath et al. |
| 9,979,600 B2 | 5/2018 | Shor et al. |
| 10,067,171 B2 | 9/2018 | O'Keeffe et al. |
| 10,069,607 B2 | 9/2018 | Shor et al. |
| 10,158,389 B2 | 12/2018 | Gale et al. |
| 10,237,765 B1 | 3/2019 | Bradley |
| 10,476,589 B2 | 11/2019 | Heath et al. |
| 2014/0056209 A1* | 2/2014 | Park ............... H04W 88/04 370/315 |
| 2015/0358928 A1 | 12/2015 | Dural et al. |
| 2017/0245162 A1 | 8/2017 | Beck et al. |
| 2017/0294928 A1 | 10/2017 | Gale et al. |
| 2017/0317717 A1* | 11/2017 | Trojer ............... H04W 24/08 |
| 2017/0353929 A1 | 12/2017 | Tacconi et al. |
| 2018/0070254 A1 | 3/2018 | Hannan et al. |
| 2018/0081047 A1 | 3/2018 | Gander |
| 2018/0248576 A1 | 8/2018 | Coe et al. |
| 2018/0269923 A1 | 9/2018 | Chang et al. |
| 2018/0368077 A1 | 12/2018 | Laporte et al. |
| 2019/0052294 A1 | 2/2019 | Abdelmonem |
| 2019/0222243 A1 | 7/2019 | Abdelmonem |
| 2019/0326986 A1 | 10/2019 | Heath et al. |

OTHER PUBLICATIONS

Anritsu Company, Spectrum Master Compact Handheld Spectrum Analyzer, Aug. 2019, United States.

Signalcraft Technologies Inc., CPRI test done brilliantly and affordably, SC2820, SIQMA, CPRI Analyzer, Jun. 6, 2018.

Zhang et al., Compressed Impairment Sensing-Assisted and Interleaved-Double-FFT-Aided Modulation Improves Broadband Power Line Communications Subjected to Asynchronous Impulsive Noise, IEEE, 10.1109/ACCESS.2015.2505676, Dec. 4, 2015.

Huang et al., Wireless Spectrum Occupancy Prediction Based on Partial Periodic Pattern Mining, IEEE Transactions on Parallel and Distributed Systems 25, No. 7 (2013): 1925-193, Nov. 8, 2013.

Viavi Solutions Inc., Easy Remote Testing of Radiohead Operation with CPRI and OBSAI, 30173210 906 0317, 2017.

Blackard et al., Measurements and Models of Radio Frequency Impulsive Noise for Indoor Wireless Communications, IEEE Journal on Selected Areas in Communications, vol. 11, No. 7, Sep. 1993.

Anritsu Company, MT1000A MU100040A/MU100040B Network Master Pro Operation Manual, First Edition, Document No. 10580-00443, Rev. A, 2017, pp. 1-112.

Anritsu, Base Station Transmits: Test Measurement, How PIM Over CPRI Makes Field Testing More Efficient, Dec. 7, 2018, pp. 1-9.

Murali et al., Design of Nano Base Stations for Future Broad Band Applications, vol. 2, Special Issue 01, Oct. 2016, ISSN: 2455-3778, pp. 226-229.

Viavi, CellAdvisor™ JD746B/JD786B RF Analyzers, 2016, pp. 1-16.

Viavi, Increase RF Visibility with CPRIAdvisor, 2017, pp. 1-7.

* cited by examiner

Job Information

| Name | Value |
|---|---|
| Job ID | |
| Customer Name | |
| Contractor Name | |
| Operator Name | |
| Circuit ID | |
| Comment | |

*FIG. 8A*

CPRI Link

| Name | Value |
|---|---|
| Port | Port1 |
| State | Active |
| RxPwr | -6.5 dBm |
| Rate | Rate7 |

*FIG. 8B*

Site Configuration

| AxC | Frequency(MHz) | BW(MHz) |
|---|---|---|
| 0 | 780.000 | 5 |
| 1 | 780.000 | 10 |
| 2 | 780.000 | 10 |
| 3 | 780.000 | 5 |
| 4 | 780.000 | 5 |
| 5 | 780.000 | 5 |
| 6 | 780.000 | 5 |
| 7 | 780.000 | 5 |
| 8 | 780.000 | 5 |
| 9 | 780.000 | 5 |
| 10 | 780.000 | 5 |
| 11 | 780.000 | 5 |
| 12 | 780.000 | 5 |
| 13 | 780.000 | 5 |
| 14 | 780.000 | 5 |
| 15 | 780.000 | 5 |
| 16 | 780.000 | 5 |
| 17 | 780.000 | 5 |
| 18 | 780.000 | 5 |
| 19 | 780.000 | 5 |
| 20 | 780.000 | 5 |
| 21 | 780.000 | 5 |
| 22 | 780.000 | 5 |
| 23 | 780.000 | 5 |
| 24 | 780.000 | 5 |
| 25 | 780.000 | 5 |
| 26 | 780.000 | 5 |
| 27 | 780.000 | 5 |
| 28 | 780.000 | 5 |
| 29 | 780.000 | 5 |
| 30 | 780.000 | 5 |
| 31 | 780.000 | 5 |

*FIG. 8C*

Summary

| AxC | BW(MHz) | PIM(dB) | Peaks |
|---|---|---|---|
| 0 | 5 | 2.7 | 5 |
| 1 | 10 | 1.5 | 2 |
| 2 | 10 | 0.2 | 8 |
| 3 | 5 | 11.3 | 3 |

*FIG. 8D*

Analysis

| Diagnostics |
|---|
| Internal PIM detected on AxC 3. |
| Potential Ubiquiti interferer at 780 MHz detected on AxC 0, AxC 1, AxC 2, AxC 3. |
| Identical interferer at 778 MHz detected on AxC 1, AxC 2. |
| Interferer (-1.22 dB) detected at 779 MHz on AxC 3. |
| Identical interferer at 783.68 MHz detected on AxC 2. |
| Interferer (-6.86 dB) detected at 780.23 MHz on AxC 0. |
| Interferer (-8.59 dB) detected at 778.82 MHz on AxC 0. |
| Interferer (-10.96 dB) detected at 784.08 MHz on AxC 2. |
| Identical interferer at 783.7 MHz detected on AxC 2. |
| Interferer (-11.76 dB) detected at 784.48 MHz on AxC 2. |
| Interferer (-12.05 dB) detected at 778.91 MHz on AxC 0. |
| Interferer (-13.51 dB) detected at 781.5 MHz on AxC 3. |
| Interferer (-17.14 dB) detected at 779.9 MHz on AxC 0. |

*FIG. 8E*

Peaks for AxC0

| Peaks | Frequency(MHz) | Power(dB) |
|---|---|---|
| 1 | 778.815 | -8.6 |
| 2 | 778.909 | -12.0 |
| 3 | 779.900 | -17.1 |
| 4 | 780.000 | -3.9 |
| 5 | 780.225 | -6.9 |

Peaks for AxC1

| Peaks | Frequency(MHz) | Power(dB) |
|---|---|---|
| 1 | 778.006 | 6.7 |
| 2 | 780.000 | -9.6 |

Peaks for AxC2

| Peaks | Frequency(MHz) | Power(dB) |
|---|---|---|
| 1 | 777.996 | 12.9 |
| 2 | 780.000 | 0.3 |
| 3 | 783.679 | -8.0 |
| 4 | 783.689 | -3.7 |
| 5 | 783.698 | -11.0 |
| 6 | 783.708 | -12.1 |
| 7 | 784.083 | -11.0 |
| 8 | 784.478 | -11.8 |

Peaks for AxC3

| Peaks | Frequency(MHz) | Power(dB) |
|---|---|---|
| 1 | 779.000 | -1.2 |
| 2 | 780.000 | -3.9 |
| 3 | 781.498 | -13.5 |

AUTOMATED ANALYSIS OF RF SPECTRUM

CROSS-REFERENCE TO RELATED APPLICATION(S)

The present disclosure claims priority to U.S. Provisional Patent Application No. 62/861,544, filed Jun. 14, 2019, U.S. Provisional Patent Application No. 62/791,202, filed Jan. 11, 2019, and U.S. Provisional Patent Application No. 62/819,731, filed Mar. 18, 2019, the contents of each are incorporated by reference herein.

FIELD OF THE DISCLOSURE

The present disclosure generally relates to network testing. More particularly, the present disclosure relates to systems and methods for automated analysis of Radio Frequency (RF) spectrum.

BACKGROUND OF THE DISCLOSURE

Mobile network operators (MNOs) can locate RF interference issues in fiber-based mobile networks using real-time, high-resolution RF spectrum analysis over CPRI (Common Public Radio Interface), evolved eCPRI, etc. CPRI, eCPRI, etc. are standards that defines an interface between Radio Equipment Controllers (REC) and Radio Equipment (RE). CPRI and eCPRI allows replacement of copper or coaxial cables between a radio transceiver and a base station, such as via fiber. For example, EXFO's OptiсalRF™ application provides access to the RF signal through the digital CPRI link available at the base station, located at the bottom of the cell tower or kilometers away as in a Centralized Radio Access Network (C-RAN) architecture. Technicians can quickly and accurately identify critical interference issues such as external RF interference, and internal and external Passive Intermodulation (PIM).

The detection of interferers in RF spectrum is a common task carried out by technicians in the field. Interference appears in spectrum as persisting peaks. The more powerful ones show up on an RF spectrum in just about any conditions. Other peaks are subtle and require careful tuning of the RF spectrum analysis equipment. An experienced technician will be able to adjust the Resolution Bandwidth (RBW), the Video Bandwidth (VBW), as well as other parameters to emphasize the particular interference being hunted for. The OpticalRF™ (ORF) application provides technicians with the speed, granularity, and clarity to identify what issues are present. ORF is a digital spectrum analyzer that extracts its information from a CPRI link instead of an analog coaxial cable. It can be used by mobile operators to measure/troubleshoot cell towers. ORF has various controls available in a spectrum analyzer: RBW, VBW, Center Frequency, Span, etc. To operate such an instrument, the user must be well trained and experimented, such as an RF expert. Mobile operators have a shortage of qualified personnel to operate such instruments.

Conventional analysis approaches can integrate some version of automated measurement, but this always revolves around the manipulation and visualization of a spectrum trace. Some automatically put markers on the trace with numbers on it, others put the measurements in a table next to the trace and so on. All this information centers around a spectrum trace, and this is overwhelming to a non-expert technician. As more and more antennas are installed, there is a shortage of skilled and experienced technicians able to analyze RF spectrum to find interference and other states of the antenna. There is, therefore, a need to automate the analysis of the RF spectrum to facilitate the work, i.e., turning up and troubleshooting a cell tower, of the technician who is not an RF expert.

BRIEF SUMMARY OF THE DISCLOSURE

In an embodiment, a non-transitory computer-readable storage medium has computer readable code stored thereon for programming a test system to perform the steps of obtaining data from one or more tests of a link, wherein the data includes samples for Antenna Carriers (AxC) for one or more AxCs auto-detected on the link; processing the data to detect peaks on any of the auto-detected AxCs on the link; performing an analysis of any detected peaks to identify any issues on the link; and causing display of a user interface that includes a reporting of any identified issues with the user interface including a display of the identified issues and a spectrum graph. As described herein, the link can be a CPRI, eCPRI, Over-the-Air (OTA) capture, etc.

In another embodiment, a test system includes a detector configured to connect to a Common Public Radio Interface (CPRI) link; a processor; and memory storing instructions that, when executed, cause the processor to obtain data from one or more tests of the link, wherein the data includes samples for Antenna Carriers (AxC) for one or more AxCs auto-detected on the link; process the data to detect peaks on any of the auto-detected AxCs on the link; perform an analysis of any detected peaks to identify any issues on the link; and cause display of a user interface that includes a reporting of any identified issues with the user interface including a display of the identified issues and a spectrum graph.

In a further embodiment, a method includes obtaining data from one or more tests of a Common Public Radio Interface (CPRI) link, wherein the data includes samples for Antenna Carriers (AxC) for one or more AxCs auto-detected on the link; processing the data to detect peaks on any of the auto-detected AxCs on the link; performing an analysis of any detected peaks to identify any issues on the link; and causing display of a user interface that includes a reporting of any identified issues with the user interface including a display of the identified issues and a spectrum graph.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 8A-8J are diagrams of an example report based on the results in FIG. 6;

DETAILED DESCRIPTION OF THE DISCLOSURE

Figure 1:
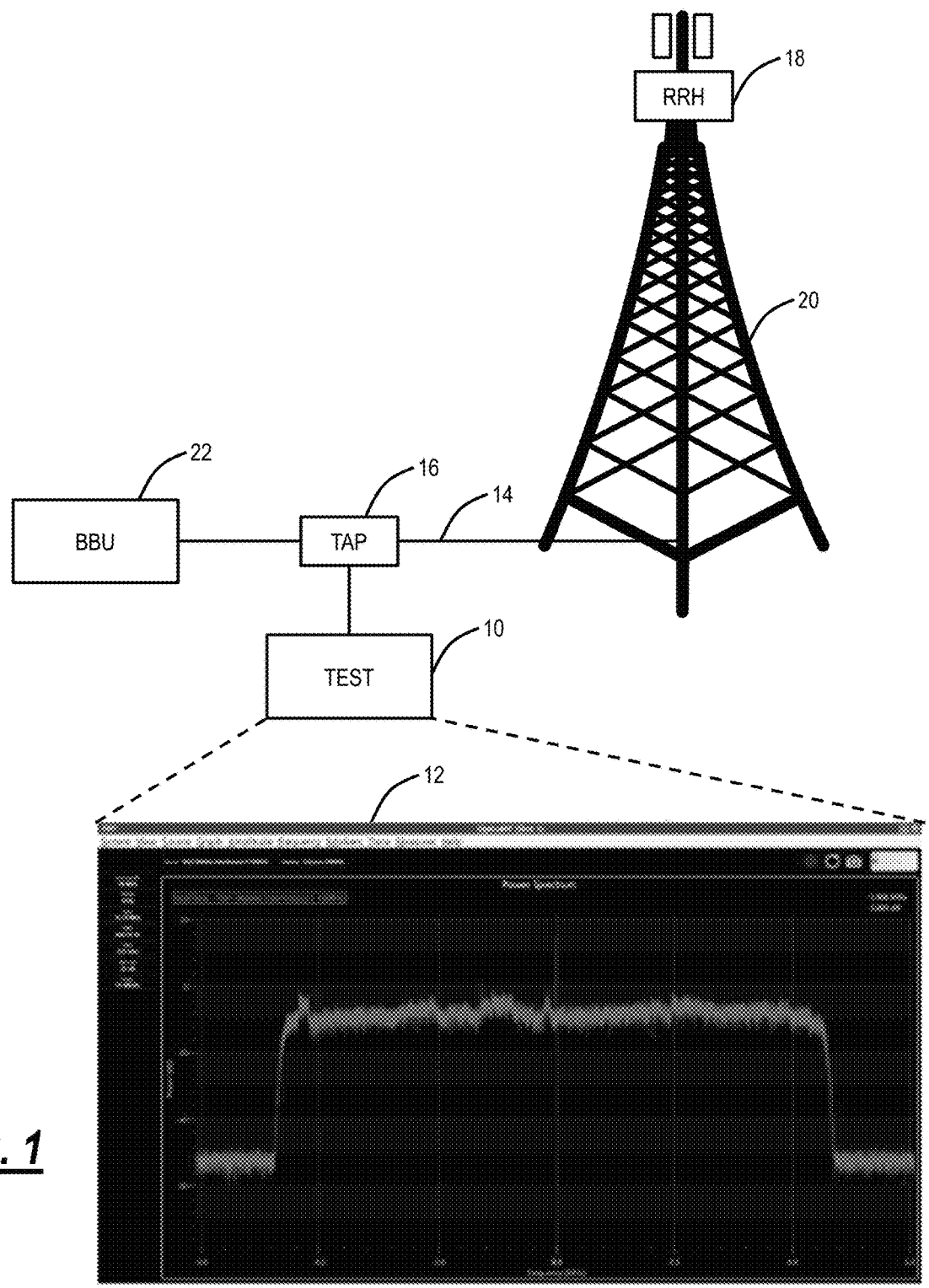
FIG. 1 is a block diagram of a test system with an associated User Interface (UI)

The present disclosure relates to systems and methods for automated analysis of Radio Frequency (RF) spectrum. Specifically, the systems and methods include the automatic configuration and detection of issues on a single trace or correlated traces of a CPRI, an eCPRT, etc. link with contextual reporting to a user. The present disclosure relates to analysis of links between Radio Equipment Controllers (REC) and Radio Equipment (RE). Those skilled in the art recognize examples of such interfaces are CPRI, eCPRT, Over-the-Air (OTA) capture, etc. and the present disclosure contemplates any such links. That is, the present disclosure contemplates operation to monitor CPRI, eCPRT, variants of CPRI and eCPRT, OTA capture, and the like, and the term link used herein is meant to cover all such embodiments. The objective is automated analysis and reporting enabling non-expert user interaction of such links. The systems and methods include minimal or no configuration by the user. Every other parameter such as RBW, VBW is automatically tuned for the measurement in progress, and other parameters such as Peak Sensitivity and PIM threshold are presented with default values. The systems and methods perform automatic measurement of key parameters, detect the presence of interferers, identify interferers, and present those results is an easily understandable format, such as a tabular and text form. The trace is presented but as a secondary element, not the main. The solution is also able to make correlations between traces. The measurement/detection being automated, it is easy once the results of each antenna are known to cycle through them all and find common interferers. This task is time-consuming and prone to error when the user tries to do it using multiple overlays of antenna traces. A qualitative assessment is provided, avoiding the user to make a manual assessment.

In an embodiment, the systems and methods include an RF spectrum analysis tool (i.e., "test system") that is configured to automatically analyze an/the RF spectrum, such as on a link. The RF spectrum analysis tool includes various diagnostic processes including a known interferer detection process, an identical interferer detection process, an external PIM detection process, and an internal PIM detection process, each of which can be performed individually or combined. The RF spectrum analysis tool can include a User Interface (UI) for technician troubleshooting.

The external PIM detection process can include the steps of detecting the presence of PIM in each antenna of a plurality of antennas of the same tower of a link, determining a level of interference of each PIM; and if the level of interference of each PIM is greater than a PIM detection threshold, determining that an external PIM is present. For example, the PIM detection threshold can be 6 dB as well as other values that are adjustable.

The internal PIM detection process can include the steps of detecting the presence of a PIM in an antenna of a plurality of antennas of the same tower of a link, determining a level of interference of the PIM; and if the level of interference of the PIM is greater than a PIM detection threshold and if not all antennas of the plurality of antennas have a PIM, determining that an internal PIM is present on that specific antenna.

The identical interferer detection process can include the steps of detecting the presence of at least one interferer for at least one antenna of a plurality of antennas of a link; determining a frequency of each interferer; comparing the list of interferers of each antenna with that of the other antennas; if more than one antenna has an interferer at the same frequency, identifying that the interferers are the same; and tagging the interferer with the list of antennas on which it appears and the frequency. The known interferer detection process can include the steps of detecting the presence of at least one interferer at a known frequency on at least one antenna of the link; and tagging this interferer at the known frequency as being potentially caused by a known device.

Test System

FIG. 1 is a block diagram of a test system 10 with an associated User Interface (UI) 12. The test system 10 is connected to a link 14 via a tap 16. For example, the link 14 can be a fiber connection between a Remote Radio Head (RRH) 18 on a cell tower 20 and a Baseband Unit (BBU) 22. For example, the link 14 can be a CPRI, eCPRI, or a variant thereof. In another embodiment, the link 14 can be an Over-the-Air (OTA) capture of RF spectrum between the BBU 22 and the RRH 18. For the OTA capture, the RF signal can be received by an antenna and processed (e.g., low-noise amplifying, band filtering, etc.). The resulting signal is sampled and optionally pre-processed (e.g. digital filtering, decimation, etc.). The resulting stream of I/Q time-domain samples can be used for the analysis of the RF spectrum in the same way as described herein for CPRI, eCPRI, etc. The tap 16 can be an optical power tap which provides a portion of the optical power on the link 14 to the test system 10 for analysis thereof.

An AxC within the link 14 is an Antenna Carrier. It is a portion of the link where IQ samples of a particular antenna are transported. For the untrained eye, it is difficult to provide an assessment of the quality of the link 14 by looking at the spectrum trace in the UI 12. Experience is required to properly set the different parameters and values such as RBW, VBW, min trace, max trace, etc. on the test system 10. Furthermore, the user has to correlate interferences on multiple AxCs manually by bringing up multiple graphs and comparing them in order to identify interferers.

Figure 2:
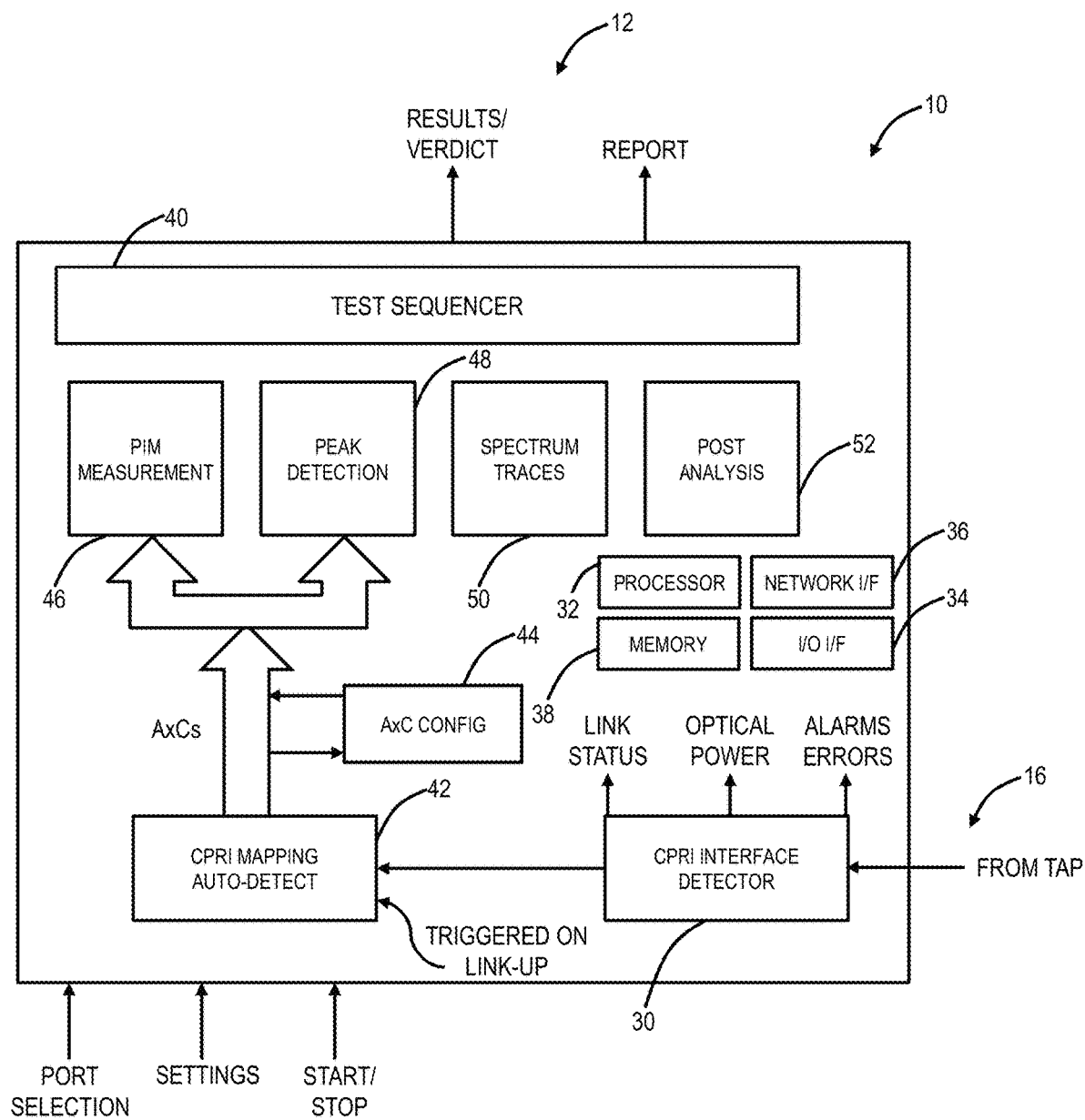
FIG. 2 is a functional block diagram of the test system.

FIG. 2 is a functional block diagram of the test system 10. The test system 10 can be a processing device that, in terms of hardware architecture, generally includes a CPRI interface detector 30, a processor 32, input/output (I/O) interfaces 34, a network interface 36, and memory 38. It should be appreciated by those of ordinary skill in the art that FIG. 2 depicts the test system 10 in an oversimplified manner, and a practical embodiment may include additional components and suitably configured processing logic to support known or conventional operating features that are not described in detail herein. The components (30, 32, 34, 36, and 38) are communicatively coupled via a local interface such as, for example, one or more buses or other wired or wireless connections, as is known in the art. The CPRI interface detector 30 is configured to connect to the link 14, such as via the tap 16. For example, when the link 14 is a fiber optic link, the CPRI interface detector 30 can be a receiver, i.e., a photodetector, that is configured to receive a signal for processing by the test system 10. Alternatively, the link 14 can be an electrical link as well with the tap 16 being a splitter or the like.

The processor 32 is a hardware device for executing software instructions. The processor 32 may be any custom made or commercially available processor, a Central Processing Unit (CPU), an auxiliary processor among several processors associated with the test system 10, a semiconductor-based microprocessor (in the form of a microchip or chip set), or generally any device for executing software instructions. When the test system 10 is in operation, the processor 32 is configured to execute software stored within the memory 38, to communicate data to and from the memory 38, and to generally control operations of the test system 10 pursuant to the software instructions. The I/O interfaces 34 may be used to receive user input from and/or for providing system output to one or more devices or components. The user input may be provided via, for example, a keyboard, touchpad, and/or a mouse. System output may be provided via a display device and a printer (not shown).

The network interface 36 may be used to enable the test system 10 to communicate on a network, such as the Internet. The network interface 36 may include, for example, an Ethernet card or adapter (e.g., 10BaseT, Fast Ethernet, Gigabit Ethernet, 10 GbE) or a wireless local area network (WLAN) card or adapter (e.g., 802.11a/b/g/n/ac). The network interface 36 may include address, control, and/or data connections to enable appropriate communications on the network. For example, the UI 12 in FIG. 1 can be provided via a display device connected to the I/O interfaces 34 and/or via a remote device connected via a network through the network interface 36.

The memory 38 may include any of volatile memory elements (e.g., Random Access Memory (RAM, such as DRAM, SRAM, SDRAM, etc.)), nonvolatile memory elements (e.g., ROM, hard drive, tape, CDROM, etc.), and combinations thereof. Moreover, the memory 38 may incorporate electronic, magnetic, optical, and/or other types of storage media. Note that the memory 38 may have a distributed architecture, where various components are situated remotely from one another, but can be accessed by the processor 32. The software in memory 38 may include one or more software programs, each of which includes an ordered listing of executable instructions for implementing logical functions. The software in the memory 38 includes a suitable operating system (O/S) and programs. The operating system essentially controls the execution of other computer programs, such as the programs, and provides scheduling, input-output control, file and data management, memory management, and communication control and related services. The programs may be configured to implement the various processes, algorithms, methods, techniques, etc. described herein.

In addition to the components (30, 32, 34, 36, and 38), the test system 10 includes functional components such as a test sequencer 40, a CPRI mapping auto-detect function 42, an AxC configuration function 44, a PIM measurement function 46, a peak detection function 48, a spectrum traces function 50, and a post-analysis function 52. These various functions (40, 42, 44, 46, 48, 50, 52) can be software instructions executed on the processor 32 for automated RF analysis. Generally, the test system 10 is configured to connect to the link 14 to perform multiple measurements orchestrated by the test sequencer 40. The measurements are performed on the AxCs detected by the CPRI mapping auto-detect function 42.

The test system 10 is a turn-up and troubleshooting tool and may be referred to as a test application or system. The test system 10 includes the test sequencer 40 which is an automated sequencer configured to fully assess the link 14 and all active AxCs, This automated sequence includes auto-discovery of link rate and Key Performance Indicator (KPI) measurements, auto-discovery of AxC mapping, automated AxC KPI measurements (e.g., PIM), automated detection of anomalies with key characteristics (e.g., frequency, bandwidth, level), identification of pre-defined Interference Types (e.g., a UHF Monitor, Wi-Fi hotspot), etc. The test system 10 requires minimal User Configuration (e.g., Center Frequency, Reference Power). Further, the test system 10 includes progressive reporting as tests are running, correlation of anomalies/interferences observed in more than 1 AxC (e.g., external PIM), and a reporting view with complete link assessment (e.g., tabular views, annotated RF Spectrum graphs, etc.).

Test Sequencer

Figure 3:
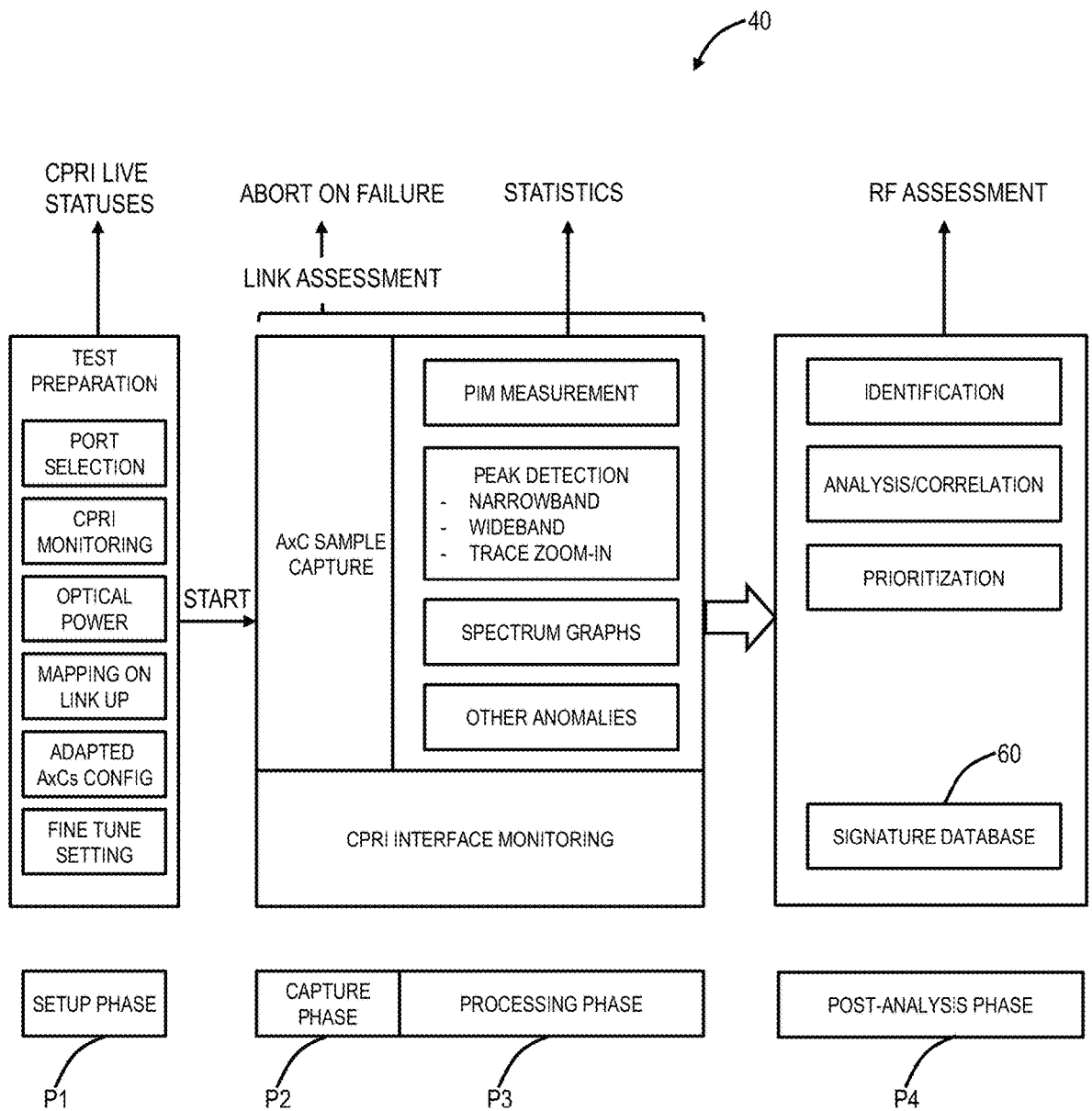
FIG. 3 is a block diagram of phases implemented by the test sequencer of the test system.

FIG. 3 is a block diagram of phases P1, P2, P3, P4 implemented by the test sequencer 40. The test sequencer 40 controls the order and assesses the results of tests. The test system 10 can automatically abort a test if any of the following conditions are met and report the applicable state.

If the test is started while the Auto-Detect was in progress but not yet completed, the test continues and lets the auto-detect complete before starting the phases. In the event the test is aborted, a global pass/fail verdict is failed. The test system 10 automatically stops once the last phase in the sequence is completed. In the event that a test has run partially but has aborted, the partial results are available. Control is available to restore to default the values for the test system 10 configuration and monitoring parameters upon request when the test is stopped.

The phases include a setup phase P1, a capture phase P2, a processing phase P3, and a post-analysis phase P4. The setup phase P1 includes various configurations as well as a live CPRI status. The configurations can include port selection, CPRI monitoring, optical power, mapping on/link up, adapted AxCs configuration, and fine-tune settings. The port selection parameter determines which port is used for the test. When a test is not running and the physical port selected for the test changes from any state to Link-Up, it is considered a trigger for an auto-detect process. When the result status of the auto-detect process is a success, the mapping is automatically applied. The auto-detect process is not triggered as long as the test is running. In the event that the link is unstable and transitions again to Link-Up (possibly multiple times) while the previous auto-detect process has not yet completed (either failure or success), the triggering of a new auto-detect process is held until the previous one completed.

The AxC configuration function 44 can include an AxC List with the AxCs associated to the Link 14. By default, the AxC list contains a set number of AxCs. In the event that the auto-detect process result is a failure or shows no activity, the previous AxC List is kept. Each AxC is characterized using the following parameters: AxC number, center frequency, bandwidth, and an enable/disable parameter (to include a particular AxC). The AxC number can be a sequential number starting at 0 assigned from the first AxC to the last. The bandwidth is automatically determined from the auto-detect process (e.g., in units of MHz). The center frequency parameter determines the center frequency of the AxC. The center frequency can be fixed when the auto-detect process is in progress, i.e., not configurable. Example values of the center frequency can be in a range of 0 to 50 000 MHz with a resolution of 0.001 MHz.

Upon a start, entering the capture phase P2 from the setup phase P1, a snapshot of the configuration is kept such that any subsequent auto-detect that could occur after the test is stopped does not disrupt the results.

Note, the measured values in the captured AxC samples do not represent the real signal level. The present disclosure can provide the actual signal level from the captured samples. Each equipment has a fixed offset between the measured values and the real signal level. It is possible for the user to input this offset in the configuration, but the present disclosure provides automation of the test. As such, the user can select a type of equipment (e.g., radio equipment (RRH)) from a menu with the test system 10 having the corresponding offset in a database.

The test system 10 can support a calibration value that is applicable to one or more AxCs of the AxC List, e.g., a range of 0 to −200 dBm/bit with a granularity of 1 dBm/bit.

For capturing AxC samples, the test system 10 can carry out RF calibration from the IQ samples with dBm/bit to obtain absolute values of the real power levels instead of a normalized amplitude reading. The calibration parameters are fixed based on the radio equipment (RRH). During setup, the user can pick the RRH equipment from a list of predetermined equipment. The test system 10 uses a lookup table to retrieve a compensation offset value. The user may use the real power levels, for example, in complaints for competing power levels. Example test results would be as follows: The user selects a specific RRH type during configuration that has an offset of 58, the interferer generates −32 dBm of noise in the spectrum, the test system converts this measured valued into a real signal level of −90 dBm.

Once the test is started, IQ samples from each item in the AxC list are captured in the capture phase P2 and provided to the processing phase P3. The processing phase P3 includes a PIM measurement, peak detection, spectrum graphs, and other anomaly detection. The test system 10 supports the PIM measurement with a PIM threshold parameter. A unique PIM Threshold parameter is applicable for all items of the AxC List. A single PIM Threshold is applied to one or more AxCs. The duration of the PIM Measurement phase is of sufficient length to allow for stable and accurate measurement.

The test system 10 detects peaks for each item of the AxC List. The duration of the peak detection is of sufficient length to allow for accurate detection. For each item of the AxC list, a full span spectrum trace snapshot is produced. The spectrum trace snapshot shows the minimum, maximum, and average traces. The spectrum trace snapshot span can be the bandwidth of the AxC. The spectrum trace snapshot amplitude and scale can be adjusted to show all traces, including the peaks. The RBW used to produce the spectrum trace snapshot is reported. Each detected peak can be marked with a special symbol.

For each peak of each AxC in the AxC List, a zoomed-in spectrum trace snapshot is produced. The zoomed-in spectrum trace snapshot shows the average trace allowing a clear view of the peak. The zoomed-in spectrum trace snapshot span can be at least twice the bandwidth of the detected peak. The zoomed-in spectrum trace snapshot amplitude and scale can be adjusted to show the peak clearly. The RBW used to produce the zoomed-in spectrum trace snapshot is reported. Each detected peak can be marked with a special symbol.

The post-analysis phase P4 includes a post-analysis list with entries generated therein. In the event that the test sequencer 40 needs to abort the test due to alarms/errors on the link 14, a CPRI Link Fault entry is added in the post-analysis list. For each peak of each AxC in the AxC List, the test system 10 tries to identify the peak and adds an entry in the post-analysis list on a positive match. When the same peak is identified on more than one AxC, all occurrences are reported as a single entry in the post-analysis list, listing AxCs where the peak was identified.

For automated analysis, if the PIM verdict is failed for items of the AxC List (e.g., the enabled AxCs), the PIM assessment is external PIM for all AxCs of the AxC List. If the PIM verdict is failed for some items of the AxC List, but not all, the PIM assessment is internal PIM for the AxCs having a failed verdict. The PIM assessment is reported in the post-analysis list as a single entry with all affected AxCs.

For AxCs of the AxC List that have unidentified peaks, the test system 10 finds peaks that are at the same frequency on more than one AxC. The criteria to declare the same frequency is a peak that falls within the resolution of the peak detector. An identical interferer entry in the post-analysis list can report the following information: frequency, list of AxCs having this peak, worst relative power, etc. Out of all the unidentified peaks and identical interferers entries in the post-analysis list, entries can be sorted based on the strongest relative power for top interferers. For the identical interferer entries, the AxC presenting the strongest relative power can be used to compare with the other entries. All other entries that go beyond the top interferers can be dropped from the post-analysis list.

Once the post-analysis phase P4 is completed, the post-analysis list entries can be re-ordered with the following priority: CPRI Link assessment, PIM assessment, peak identification, and top interferers. If the post-analysis list is empty at the end of the post-analysis phase P4 (meaning no anomalies were found), then an entry can be added for no anomalies detected.

Control is available to view a selected AxC or a selected peak in a live view application in the UI 12. Any configuration changes done in the live view application do not affect the configuration and results of the test system 10. Once in the live view application, there is a control to return back to the main page. When jumping to the live view application to view an AxC or multiple AxCs, the following conditions are observed: the source configuration is automatically selected to the affected AxCs. The minimum and maximum traces are displayed. The real-time trace of each affected AxCs is displayed and overlaid when multiple. The span can be the bandwidth of the largest AxC. The amplitude and scale can be adjusted to show all traces, including the peaks. The RBW is the same as the one used to produce the snapshot. The VBW is adjusted to show a trace similar to the snapshot. The PIM Measurement is enabled on the affected traces with the same threshold as set in the test system 10.

When jumping to the live view application to view a peak, the following conditions are observed: the source configuration is automatically selected to this AxC. The minimum, maximum, and real-time traces are displayed. The frequency of the graph is centered on the selected peak. The span is the same as the peak zoom-in. The amplitude and scale are adjusted to show all traces, including the peaks. The RBW is the same as the one used to produce the snapshot. The VBW is adjusted to show a trace similar to the snapshot.

Further details are provided for the phases P1, P2, P3, P4 of the test sequencer 40. The test preparation involves all the steps that have to be done before starting the test. In its minimal form for the user, the test preparation only includes connecting the optical fiber coming from the tap 16 to the test system 10. The mapping auto-detect determines the AxCs from the link 14. Once the test is started by the user, the test sequencer 40 automatically executes each step. The CPRI monitoring provides link detection to provide a link state live status and the detected rate. The optical power monitoring monitors the optical power, with power range validation.

The CPRI mapping auto-detect 42 is automatically triggered each time the link transitions from Link Down to Link Up. Only the Detected AxCs are presented with the following information: AxC number, bandwidth. The AxC configuration function 44 has multiple features. For each AxC detected, the user can enter the center frequency. By default, the Center Frequency (CF) is 0 MHz.

Aggregation configuration is used for aggregation. Aggregation is the logical grouping of two or more component carriers (physical carriers). Long Term Evolution (LTE) higher layers use the resources blocks of the aggregation as a single pool of resources. On the air, these component carriers can be Intra-band contiguous, Intra-band non-contiguous, or inter-band. In the test system 10, aggregation makes sense for Intra-band contiguous, which is the most common. The center frequency would be applied to the aggregation. For other types of aggregation, it would be better for the user to consider the component carrier individually instead of an aggregation.

There can be a grouping of AxCs within the link 14 to know which AxCs belong to a particular RRH within the link 14. It can be used during the correlation phase for PIM assessment and reporting. The RF Calibration includes a predefined list of RRH with known dBm/bit values and also includes user-defined lists. If the link 14 goes down, the parameters can be preserved and re-applied if the same AxCs are detected (same quantity and bandwidth per AxC). The fine tune settings include the PIM Threshold and the peak sensitivity. The peak sensitivity is used to adjust the peak detection sensitivity.

Any change in setup does not affect any results of a previous test run. As an example, the mapping may change following a Link Up. The AxCs presented in the results do not change in this case. A test duration setting allows for increasing the processing duration to improve the detection of intermittent or moving interferers. Profiles are used to load a pre-defined site configuration. For example, predefined RRH profiles can be used in which center frequencies would be already populated.

After the setup phase P1, a user can activate a start button or the like to enter the capture phase P2. A full snapshot of the setup is taken and used as a basis for the results. Any subsequent change of setup or configuration does not affect the results of a test run. Once the test is started, the test can be manually stopped at any moment, but it will also stop automatically once all the steps are completed. If a condition prevents the test from being executed, it is aborted with a reason. Pressing the start button clears the previous results. During the execution of the test sequence, statistics can be presented as they become available. A test execution status can be presented throughout the test with meaningful messages such as "Collecting AxC samples," "Measuring PIM," etc. Results are frozen on stop.

In the capture phase P2, there is the execution of the test sequence. While IQ samples are extracted from the link 14 for processing, the CPRI interface is monitored in parallel. If any of the following alarms/errors are present, the test automatically aborts and reports the condition: Alarms: Loss of Signal (LOS), Link Down, Loss of Frame (LOF), R-LOS, R-LOF, Remote Alarm Indication (RAI), Defect Indication. Errors: SH, 66B Block, FAS. This helps avoid inducing false peak detection. The Optical power is also monitored although no automatic action is performed if an anomaly is detected. The condition can be simply reported. The Optical Power is reported, with power range validation. If the CPRI Interface is nominal, IQ Samples are captured from the link and provided to the processing phase P3.

In the processing phase P3, PIM measurement does not require configuration. PIM is measured on all detected AxCs. A verdict is given based on the configurable threshold. For each AxC, peak detection is performed. Both narrowband and wideband are detected. These steps can be performed simultaneously or sequentially as needed by the detection algorithm. The following statistics are reported: center frequency, relative power, bandwidth, duration/cycle of the peak. For each AxC, a spectrum graph is produced. The graph contains the minimum, average, and maximum traces. The RBW, VBW, and other settings used to produce the graph are collected. For each peak detected in each AxC, a spectrum graph zoom-in is produced showing an optimized view of the peak (single trace). Again, the RBW, VBW, and other settings used to produce the graph are collected. The spectrum graph and spectrum graph zoom-in provide control to access an embedded live view. When accessed, the live view appears with the selected AxC. proper RBW, VBW, and so on are selected for an optimized display. The spectrum graph live view can show all 3 traces. The spectrum graph zoom-in can show the average trace but is zoomed-in for optimal interferer view. Once in the live view, the user has full control as per the live RF Spectrum viewing application offering.

A peak detector function is a process that takes a number of spectrum trace samples from an AxC and applies various filters to detect the presence of interferer that is not regular LTE traffic and management signals. It is possible to initiate the peak detector function on a given AxC for a specified amount of time specified by the application running the measurements. The peak detector operates over the full mapping bandwidth of the AxC. The peak detector detects the presence of interferers, narrowband, and wideband, that are not regular LTE traffic and management. Management Channels on each side of the spectrum shoulders do not create false positive. The peak detector uses a sufficient amount of traces to provide a stable measurement.

For example, the peak detector can report the following statistics for each interferer found: relative power: Range: +/−200 dB, Resolution: 0.01 dB; Power (Amplitude): Range: +/−200 dB, Resolution: 0.01 dB; Frequency: Range:

+/−50 000 MHz, Resolution: 0.001 MHz; Bandwidth: Range: 0.001 MHz to 1 MHz, Resolution: 0.001 MHz.

When more than one peak is detected within a bin of 1 kHz, the peak detector can only report the peak with the strongest relative power. The peak detector automatically adjusts the amplitude value and its unit on a per AxC basis. The frequency value is always adapted with respect to the current center frequency value associated with the AxC being processed. A peak sensitivity parameter determines the sensitivity of the peak detector function. For example, a higher number can signify a greater sensitivity.

In the post-analysis phase P4, each peak found can be compared to a signature database 60 for a potential match in an identification step. When a match is found, the peak is identified with a descriptive name, aggregating multiple instances found on many AxCs as a single entry. An example message is as follows: "Potential <name of interferer> interferer found at <CF> detected on <list of AxC>." The signature database 60 contains a collection of known interference signatures. It contains all relevant RF characteristics to positively identify an interferer, including waveform, RF Settings to detect it, margin, etc. It can be pre-built with known interferers. It is possible to update the signature database 60. A capture/report feature allows sending information about a found interferer that is not in the signature database 60 for incorporation in the pre-built database.

Peak identification is a function that takes the peaks found by the peak detector, and one by one tries to match the signature to a collection of known interferers. When found, the peak is identified with the name of the suspected equipment causing this interference. Initially, only static interferers are identified. A static interferer is defined as a peak that does not change frequency or amplitude during the peak detection process. The peak identification function tries to identify each by matching its key characteristics to the collection of known interferer signatures. The peak identification function can support static and dynamic peaks. The peak signature is associated with the following key characteristics: center frequency, waveform, peak detector Settings to detect it. On a positive match, the peak identification function reports the name of the Interferer.

The peak identification function considers a margin for each signature. Indeed, by definition, an interferer is an unwanted source of RF energy that is emitted by a device that is not under the control of the owner/operator of the spectrum where the interferer is located. This uncontrolled device might be of varying quality and may be made with a local oscillator of poor quality. The interferer might, therefore, emit energy at a frequency that is not very precise depending on various factors such as temperature and aging. The peak identification function needs a margin to detect it; the interferer will not be at the same exact frequency from site to site. The margin is dependent on the known variance of the peak signature. The collection of signatures is kept in a repository on the platform (the signature database 60) that can be modified independently of the software package. Changes made to the collection of signatures is applied next time the test is started.

Analysis/Correlation identifies anomalies that cannot be identified when each AxC is analyzed individually. Types of correlations include internal/external PIM determination, identical interferers among AxCs, and top interferers. External PIM detection is another feature of the post-analysis phase P4. When PIM is present on AxCs simultaneously, it is unlikely that all antennas are affected simultaneously by an internal connection problem such as a bad connector. In this case, the most probable root cause is external PIM, such as a metallic object in front of the antennas which affects all antennas. Therefore, when a PIM verdict is declared on the AxCs, external PIM is declared. An example message is as follows: "External PIM detected on <list of AxC>." Internal PIM detection occurs when PIM affects some AxCs but not all. An example message is as follows: "Internal PIM detected on <list of AxC>." For each detected peak on each AxCs, a correlation is performed to find interferers that are at the same frequency. If found, they are declared as identical interferers. An example message is as follows: "Identical interferer at <CF> detected on <list of AxC>."

When a system (e.g., the RRH 18 connected to the BBU 22 via the link 14) is in a very noisy environment, the number of peaks can grow large. The peaks that most likely cause a problem for the operator are the most powerful ones. Unidentified peaks, either unique or listed as identical interferers, are analyzed to pick a top set presenting the highest relative power. These are the top interferers.

When the number of detected peaks is large, the post-analysis message window can be overwhelming for the user. Some problems are more serious than others. It is, therefore, useful to prioritize the post-analysis messages. The post-analysis messages can be presented, for example, with the following priority: PIM, identified peaks, top interferers. This is done by the Prioritization module.

The test system 10 can detect that the link 14 itself has an issue. A discontinuity on the link 14 will cause an enormous peak, detectable by the test system 10. A bit error in the encoding can also hint at such an issue. The link 14 should be fixed first (for example, with an optical link, using an Optical Time Domain Reflectometer (OTDR) to detect and determine the issue) before other RF issues are addressed.

Example GUI Screens

Figure 4:
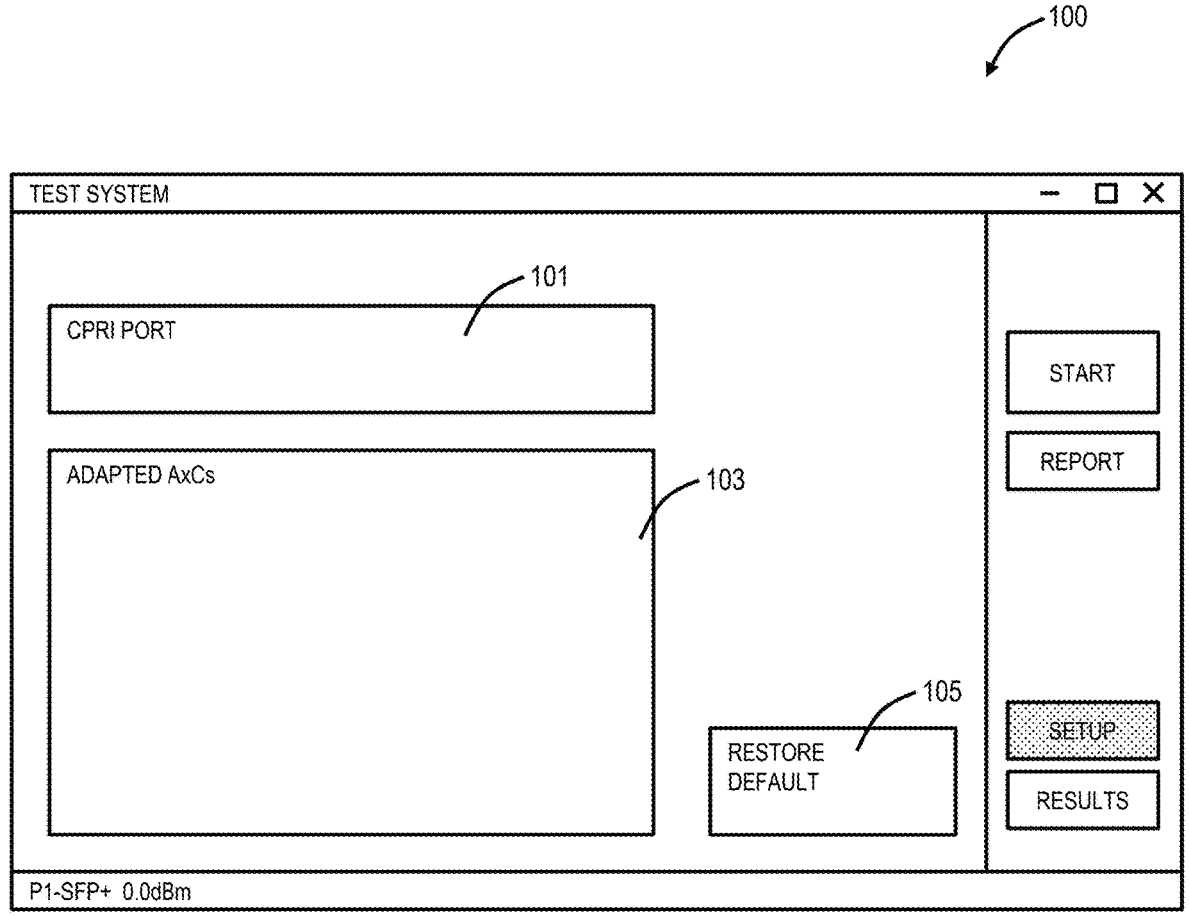
FIG. 4 is a diagram of a Graphical User Interface (GUI) for the test system at setup.

FIG. 4 is a diagram of a Graphical User Interface (GUI) 100 for the test system 10 at setup. In this example, the test system 10 is connected to port P1 of an SFP+ with an optical power of 0.0 dBm (as illustrated in the bottom left of the GUI 100). A CPRI port 101 displays a port selection as well as link status, the detected rate, and the optical power. An adapted AxCs table 103 displays the detected AxCs with the AxC number, bandwidth, and center frequency. The adapted AxCs table can include an aggregation button to access a pop-up screen. The adapted AxCs table can include a calibration button to access a list of predefined RRH. The adapted AxCs table can also include an advanced button to access a pop-up screen with the PIM threshold and peak sensitivity settings. A restore default button 105 is also provided.

Figure 5:
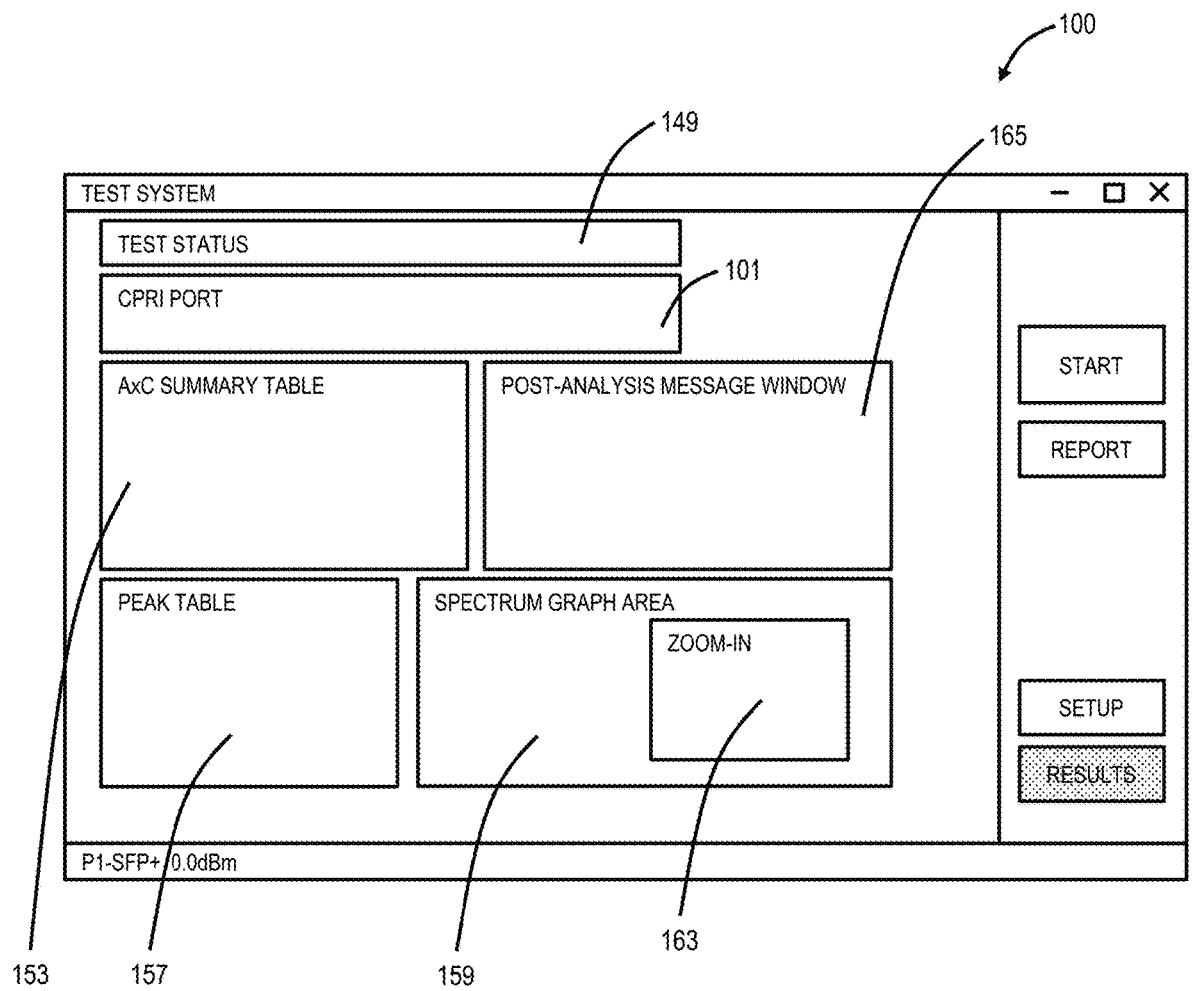
FIG. 5 is a diagram of a GUI for results through the test system.

FIG. 5 is a diagram of a GUI 100 for results through the test system 10. A test status area 149 includes the start time, progress bar, and test status. The CPRI Port 101 indicates link status, detected rate, optical power with range, current alarms/errors. An AxC summary table 153 lists the AxC number, bandwidth, center frequency, PIM value, and the number of peaks. A selection of an AxC in the AxC summary table 153 will trigger the displays in a peak table 157 and a spectrum graph area 159. The peak table 157 lists the peak number, the center frequency, the bandwidth, the relative power, and the power. The spectrum graph area 159 shows the RF spectrum. The settings can be shown on the graph legend (RBW, VBW, etc.). When selecting a peak in the peak table 157, a spectrum trace zoom-in is displayed in a zoom-in window 163.

A post-analysis message window 165 contains a list of post-analysis messages. It contains a global assessment. When no problems are found, a message is provided, such as "No Errors Detected." When any other anomaly is detected, the post-analysis message window 165 simply contains messages about the anomalies. The list of post-analysis messages can be automatically sorted for priority. For example, the priority can be to list the easy-to-fix issues first and the time-consuming ones below. Also, the priority can be to list the issues based on impact or severity. Other embodiments are also contemplated.

On selection of an entry in the post-analysis message window 165, the peak table 157, the spectrum graph area 159, and the zoom-in window 163 show the entry. When more than one AxC is affected, a spectrum overlay is shown, without the peak table 157.

Rows in the AxC summary table 153, the peaks table 157, and the list of post-analysis messages is selectable only when the test is not running. The AxC summary table 153 can present the following information, for example, in tabular format AxC: AxC Number; Frequency (MHz): Center Frequency; Bandwidth (MHz): Bandwidth; PIM (dB): PIM Measurement; Peaks: Number of peaks detected. The AxC summary table 153 can present only the AxCs that were detected in the link 14. When selecting a row in the AxC summary table 153, its peak table 157 and the spectrum trace is displayed.

The list of post-analysis messages in the post-analysis message window 165 include entries displayed as per the following, for example, depending on the type of entry: no anomalies detected: No anomalies detected; CPRI Link Assessment: CPRI Link Fault; Internal PIM Assessment: Internal PIM Detected on <List of AxC>; External PIM Assessment: External PIM Detected on <List of AxC>; Identified Peak: Potential <name> interferer at <Center Frequency> detected on <List of AxC>; Unidentified Peak: Interferer (<ISR> dB) detected at <Center Frequency> on <List of AxC>; Identical Interferer: Identical interferer at <Center Frequency> detected on <List of AxC>.

When selecting an entry in the list of post-analysis messages, the spectrum trace full span and zoom-in are displayed in the spectrum graph area 159 for the AxC or AxCs affected by the entry. When a single AxC is affected by the entry, its corresponding row in the AxC summary table 153 and the peak table 157 is automatically selected. When more than one AxC is affected by the entry, the spectrum traces are displayed as overlays, and the AxC summary table 153 and the peak table 157 are not displayed.

The peak table 157 can present the following information, for example, in tabular format: Number: Peak Number; Frequency (MHz): Peak Frequency; relative power (dB): relative power; Power (<unit>): Power. When selecting a row in the peak table 157, the following behavior is observed, namely its spectrum trace zoom-in is displayed, and a special symbol for the selected peak is visibly different than the other symbols.

Figure 6:
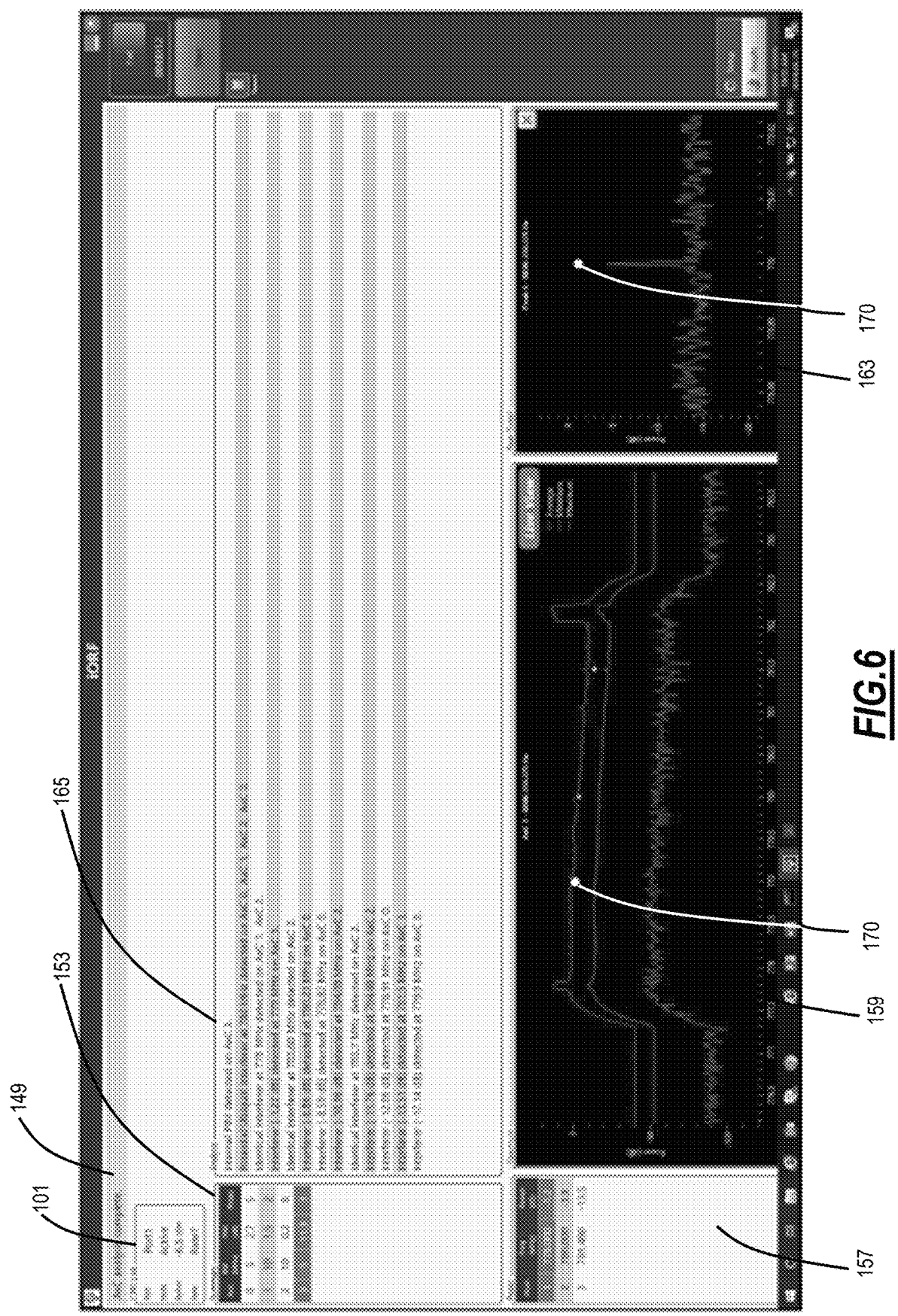
FIG. 6 is a screenshot of an example results GUI in which a test has already been performed.
Figure 7:
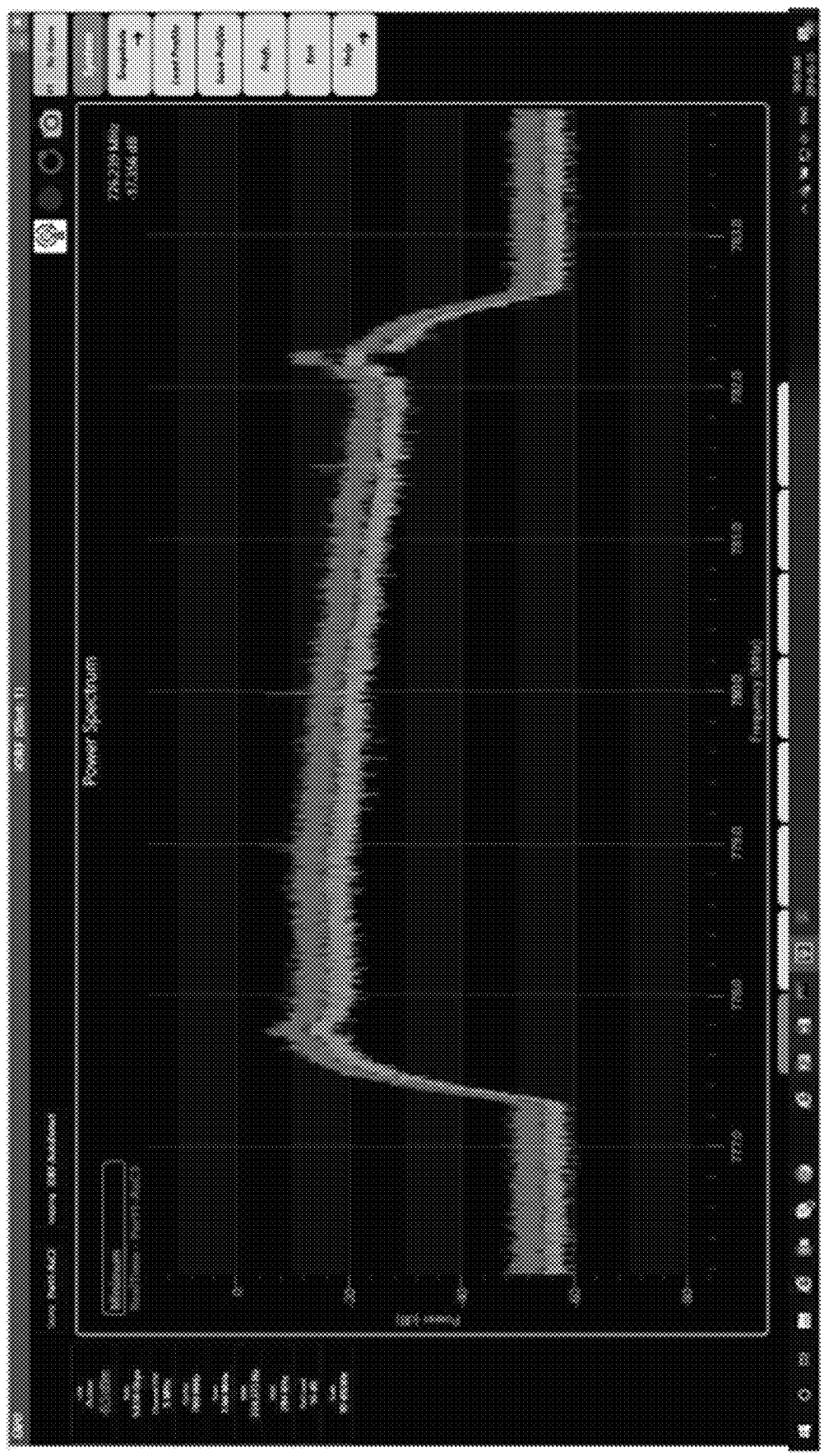
FIG. 7 is a screenshot of an example corresponding live view which has been triggered from the results window of FIG. 6.

FIG. 6 is a screenshot of an example results GUI in which a test has already been performed. Here, Peak 1 of AxC 3 is currently highlighted and displayed in the spectrum graph area 159 and the zoom-in window 163 with a marker 170. FIG. 7 is a screenshot of an example corresponding live view which has been triggered by the results window of FIG. 6. When in live-view mode, the spectrum graph area 159 and zoom-in window 163 can call upon a live RF spectrum application to show live views.

Figure 8G:
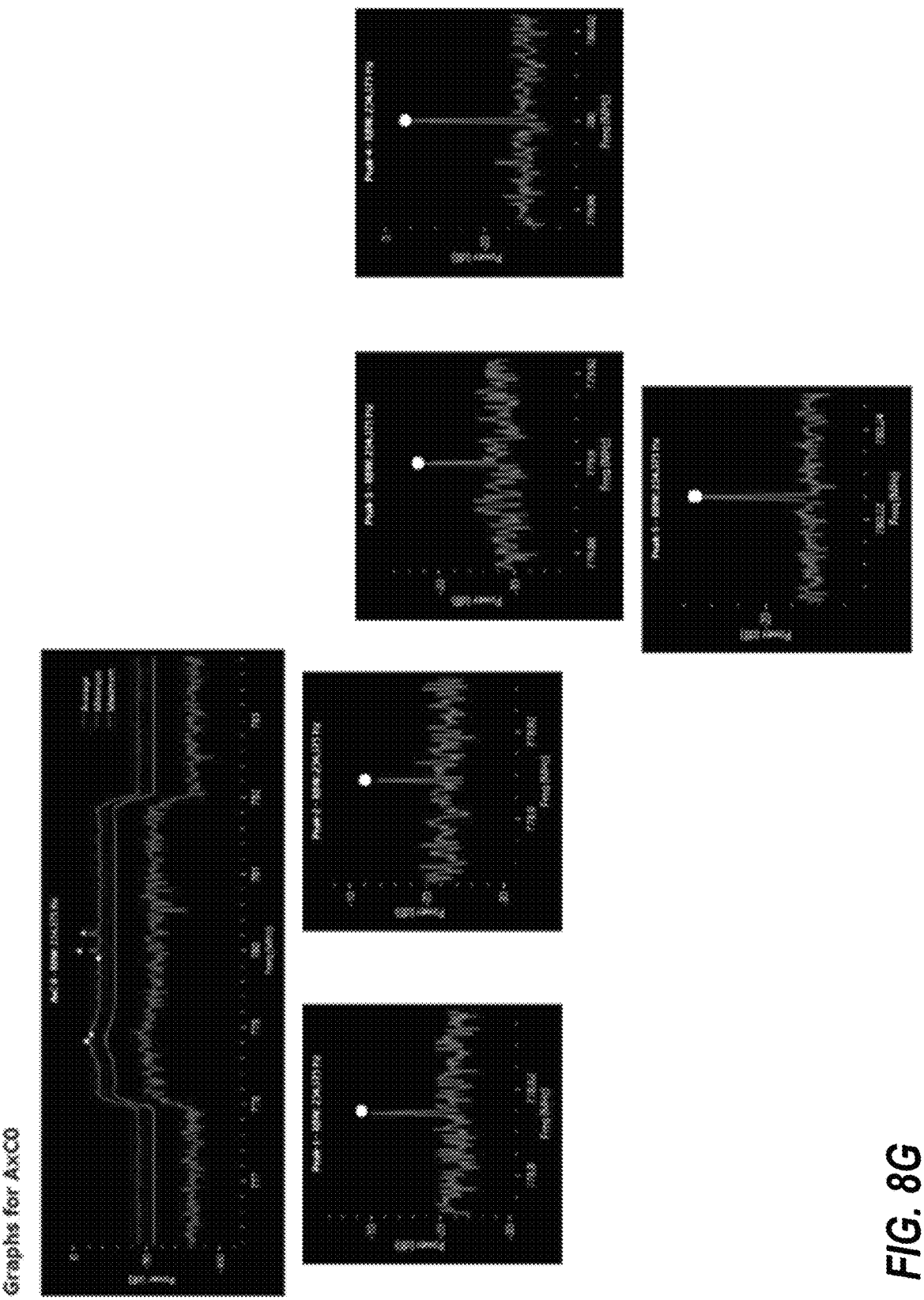
Figure 8H:
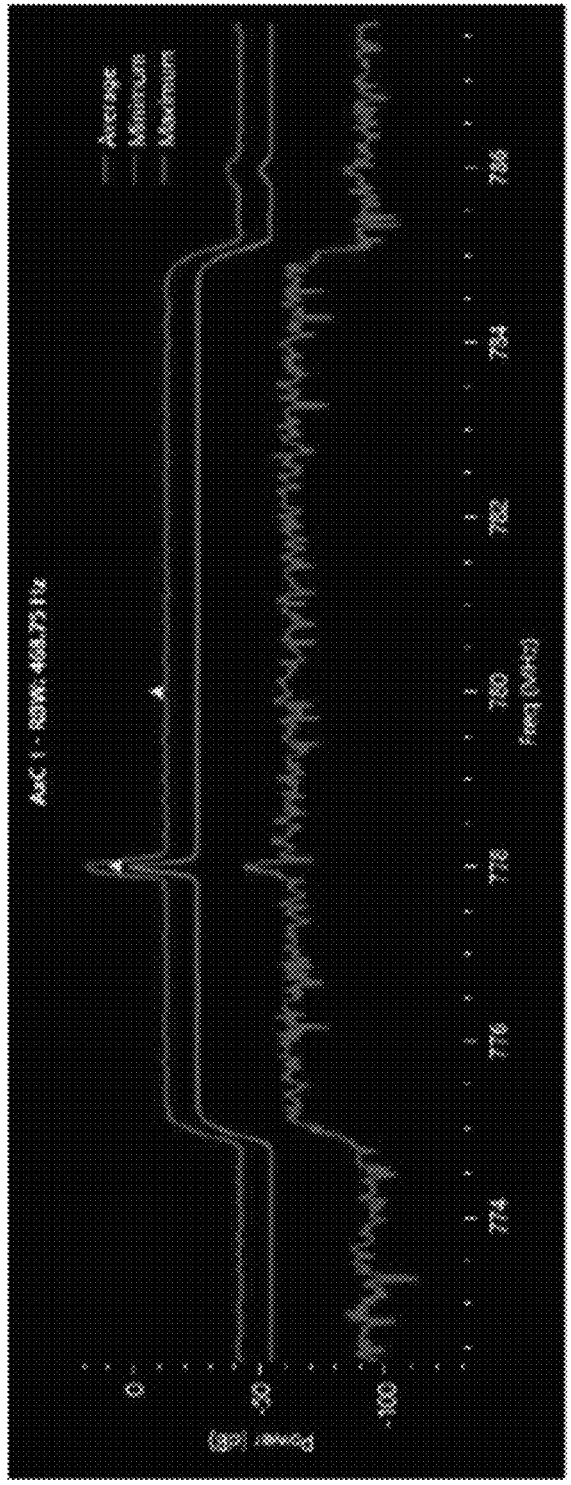
Figure 8H:
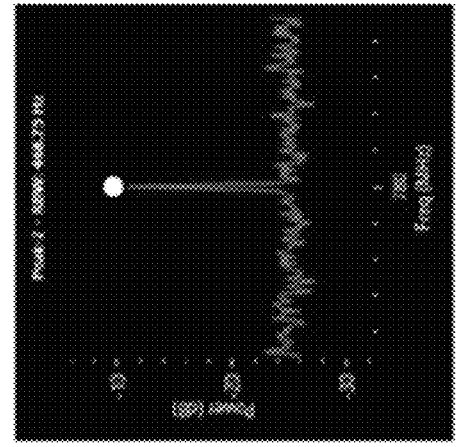
Figure 8H:
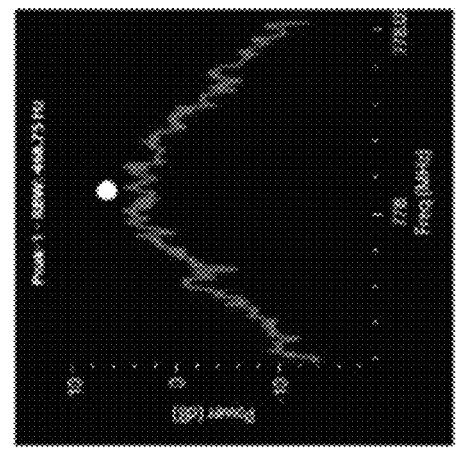
Figure 8I:
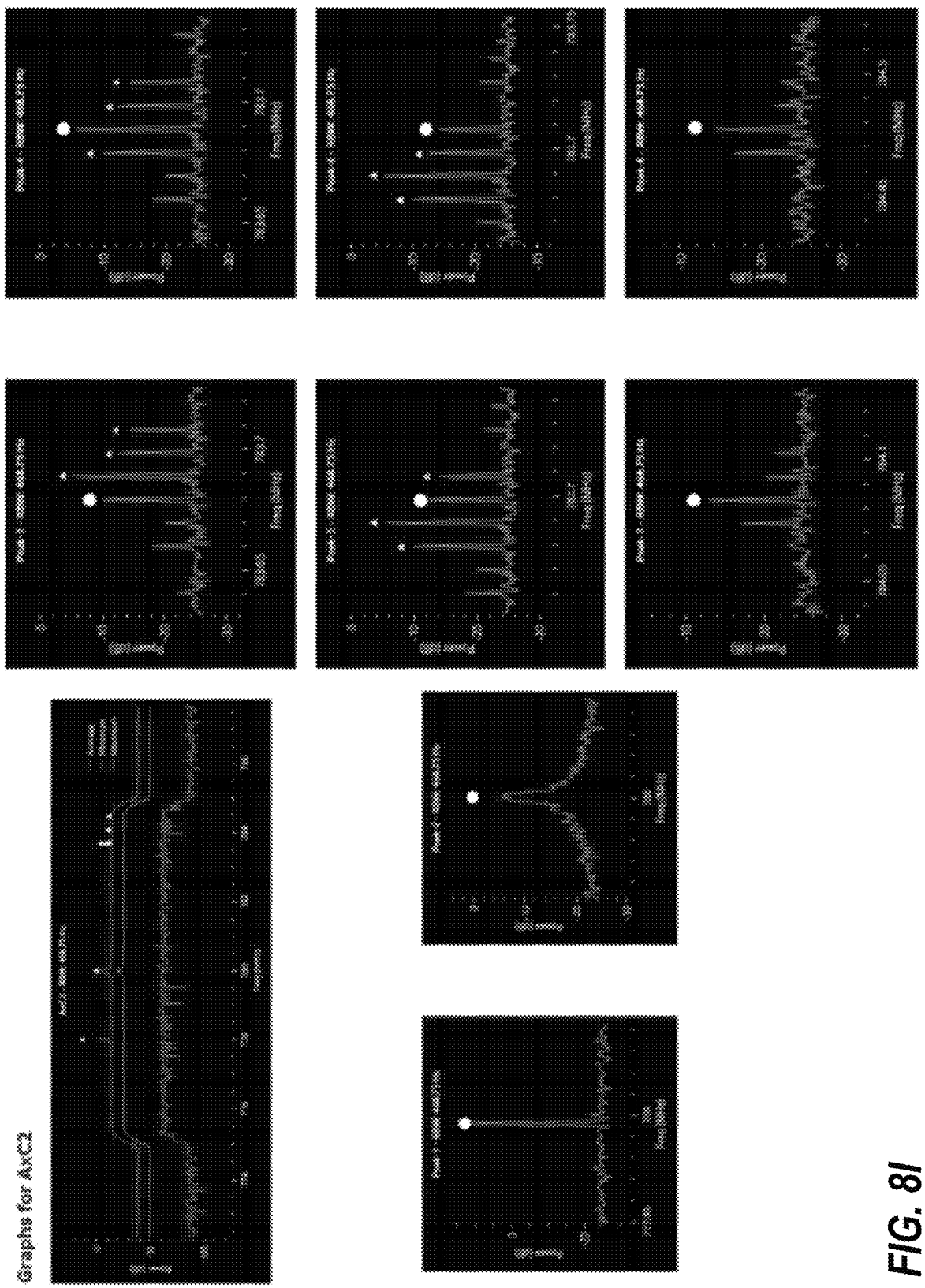
Figure 8J:
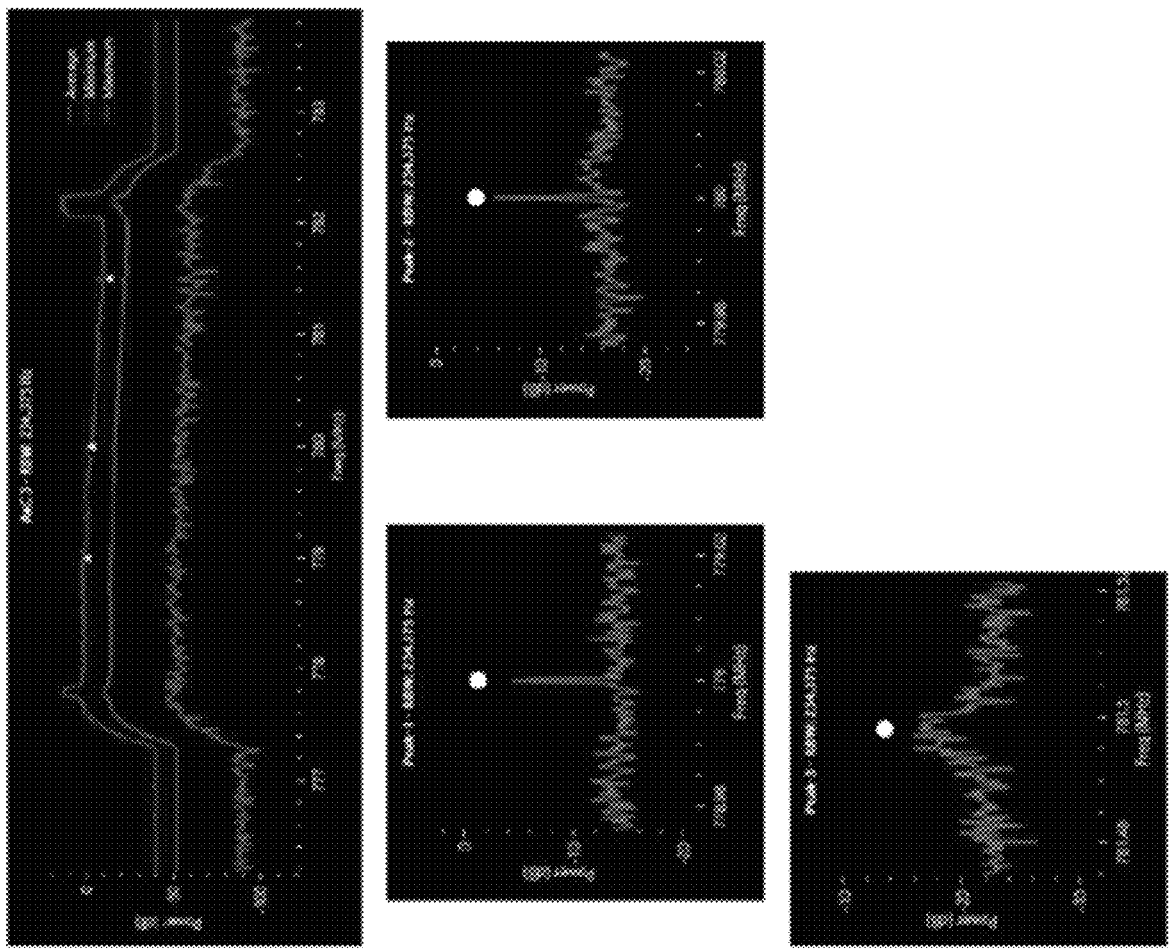

FIGS. 8A-8J are diagrams of an example report based on the results in FIG. 6. FIG. 8A is a job information table which is blank in this example. FIG. 8B is a table of the CPRI link details including the port, state, receive power, and rate. FIG. 8C is a table of a site configuration including each AxC, its frequency, and bandwidth. FIG. 8D is a summary table of the detected anomalies including the bandwidth, PIM, and peaks on each AxC. FIG. 8E is a list of diagnostics obtained during the analysis. FIG. 8F is tables of the details of each peak identified on each AxC with its frequency and power. FIGS. 8G, 8H, 8I, and 8J are graphs illustrating the best representative graph for each AxC with its detected peaks and the zoom-in graph for each detected peak.

Automated RF Analysis

The systems and methods automate the evaluation/analysis of the state of the link 14. The auto-detection of the mapping of the antennas (AxC) on the link 14 is one component of this automation. Another component is the detection and tracking of interferers in the RF spectrum. The auto-detection of PIM on an RF spectrum is yet another component. Advantageously, the systems and methods aggregate results about the link 14 to then provide analysis and preliminary diagnosis via the UI to a technician looking at interpreting the collected data about the link.

Figure 9:
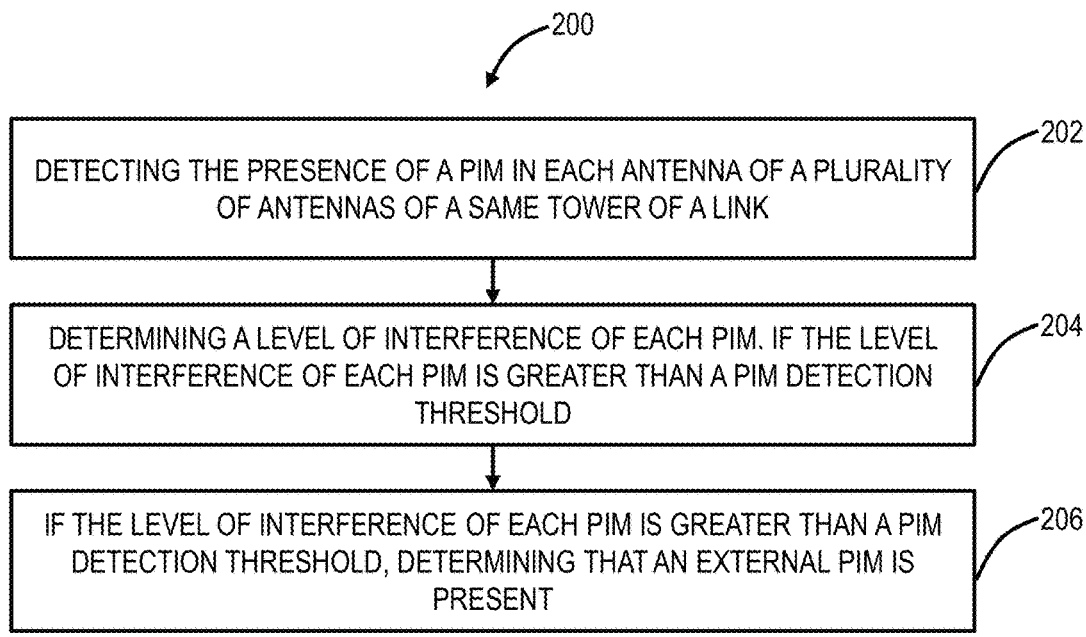
FIG. 9 is a flowchart of an external PIM detection process.

FIG. 9 is a flowchart of an external PIM detection process 200. The external PIM detection process 200 includes the steps of detecting the presence of a PIM in each antenna of a plurality of antennas of the same tower of a link (step 202), determining a level of interference of each PIM (step 204), and, if the level of interference of each PIM is greater than a PIM detection threshold, determining that an external PIM is present (step 206). In an example embodiment, the PIM detection threshold is 6 dB. The external PIM detection process 200 operates under the assumption that if all antennas of a tower have detected PIM, the PIM is caused by an external source.

Figure 10:
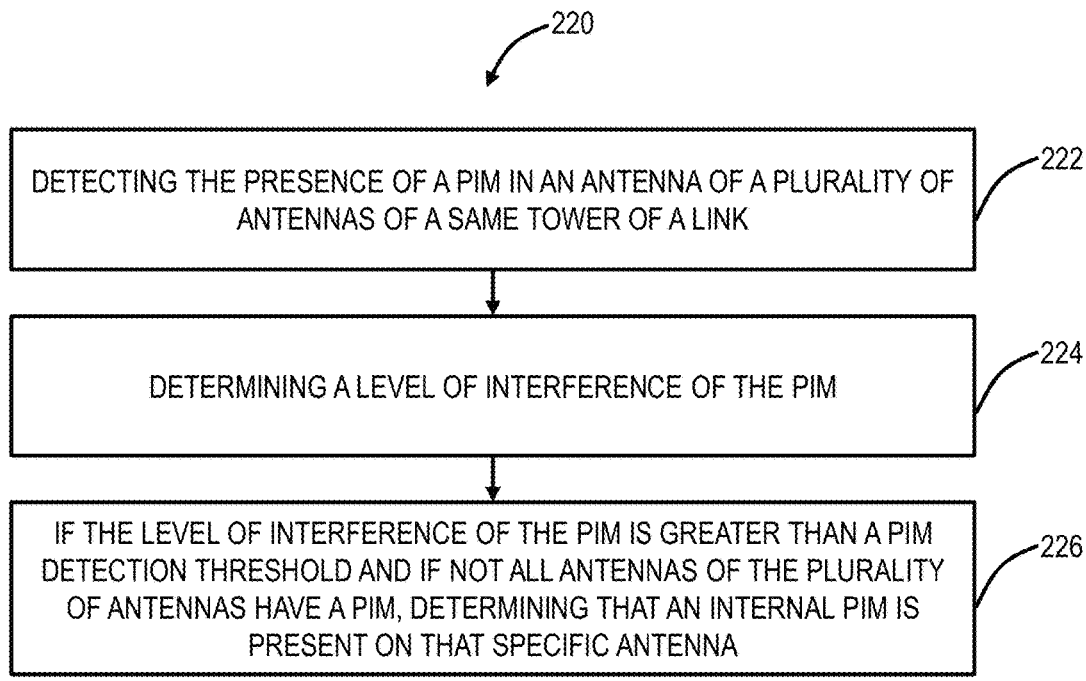
FIG. 10 is a flowchart of an internal PIM detection process.

FIG. 10 is a flowchart of an internal PIM detection process 220. The internal PIM detection process 220 includes the steps of detecting the presence of a PIM in an antenna of a plurality of antennas of the same tower of a link (step 222), determining a level of interference of the PIM (step 224), and if the level of interference of the PIM is greater than a PIM detection threshold and if not all antennas of the plurality of antennas have a PIM, determining that an internal PIM is present on that specific antenna (step 226). In an example embodiment, the PIM detection threshold is 6 dB. The internal PIM detection process 220 operates under the assumption that if not all antennas of a tower have detected PIM, the PIM is caused by an internal source.

Figure 11:
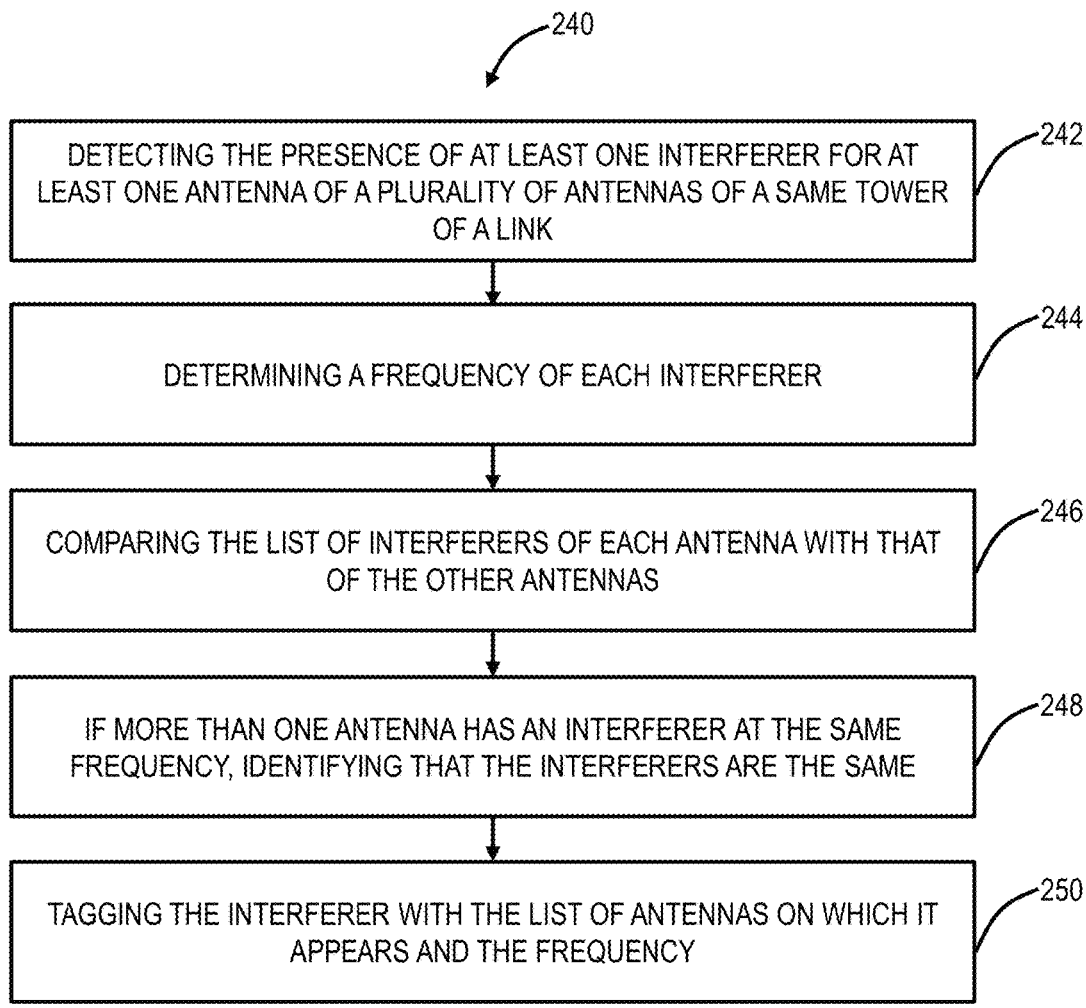
FIG. 11 is a flowchart of an identical interferer detection process.

FIG. 11 is a flowchart of an identical interferer detection process 240. The identical interferer detection process 240 includes the steps of detecting the presence of at least one interferer for at least one antenna of a plurality of antennas of a same tower of a link (step 242), determining a frequency of each interferer (step 244), comparing the list of interferers of each antenna with that of the other antennas (step 246), if more than one antenna has an interferer at the same frequency, identifying that the interferers are the same (step 248), and tagging the interferer with the list of antennas on which it appears and the frequency (step 250). It will be readily understood that the "same frequency" is within an acceptable range defined by the user.

Figure 12:
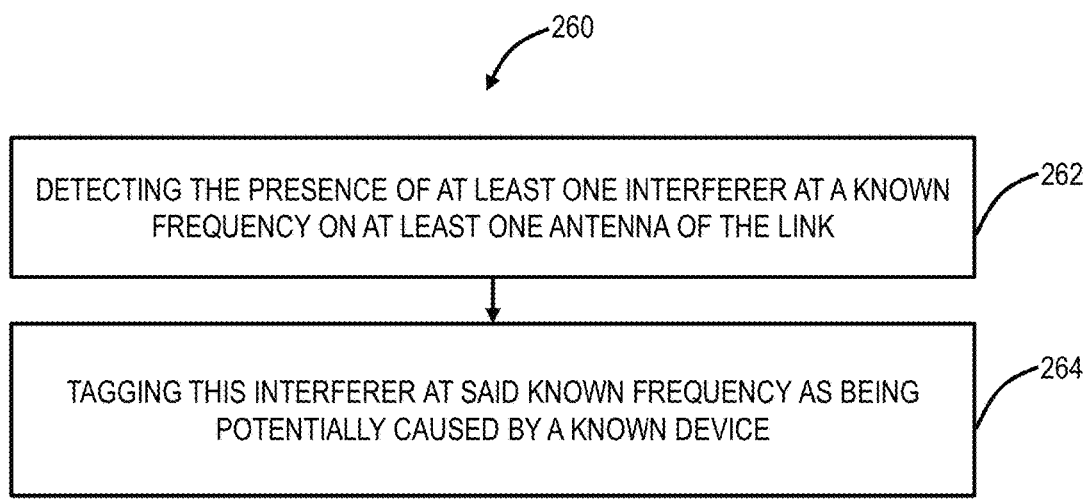
FIG. 12 is a flowchart of a known interferer detection process.

FIG. 12 is a flowchart of a known interferer detection process 260. The known interferer detection process 260 includes the steps of detecting the presence of at least one interferer at a known frequency on at least one antenna of the link (step 262), and tagging this interferer at said known frequency as being potentially caused by a known device (step 264). The known device is one predetermined to interfere at the known frequency. In an example embodiment, the known device is a third-party Wi-Fi device known to cause interferences at 780 MHz. The known interferer detection process 260 therefore identifies that a Ubiquiti device has likely caused the interference detected at the known frequency of 780 MHz. In another example embodiment, the known device is a Takstar device or an Ultra High Frequency (UHF) monitor. For example, the Takstar device can be a UHF monitoring system and can cause interference at 780.00551 MHz, 783.00552 MHz, 785.00553 MHz, etc.

Those skilled in the art will appreciate the known device can be any type of device that is predetermined to cause interference. Each different known device can have a unique signature in the database 60 that can be detected along with a description to provide the user useful information for troubleshooting.

In one example embodiment, some of the interferers could exhibit modulation. The known interferer detection process 260 can detect this modulation and measures the symbol rate of the modulation. This information can be displayed on the user interface. It can further be used to correlate the information with that of a known interferer to help identify a potential cause for the interferer.

In one example embodiment, the test system 10 also prioritizes the anomalies. This could prevent overcrowding of the analysis display section in the GUI 100, which could overwhelm the user. The most serious issue among the detected interferers is identified through a set of decision rules and is displayed with an emphasis, either by displacing it at the top of the Analysis section or by discarding lower priority messages about less serious issues. Another way of prioritizing the issue is via color coding. The decision rules could take into account severity of the issue with respect to its impact on the link status, the impact that fixing an issue would have on the status of the link or the sequence in which the issues should be addressed to reach a better status. This would guide the technician in assessing the health of the link and in choosing what to fix first.

The test system 10 can include an RF spectrum analysis tool that implements the processes 200, 220, 240, 260. Also, the test system 10 can implement all of the processes 200, 220, 240, 260 in some combination as well as a subset of the processes 200, 220, 240, 260 in some combination. The test system 10 can include a plurality of other detection and diagnosis processes. For example, the RF spectrum analysis tool could include the detection of the UHF monitor and the detection of the diversity imbalance.

User Interface Example

Figure 13:
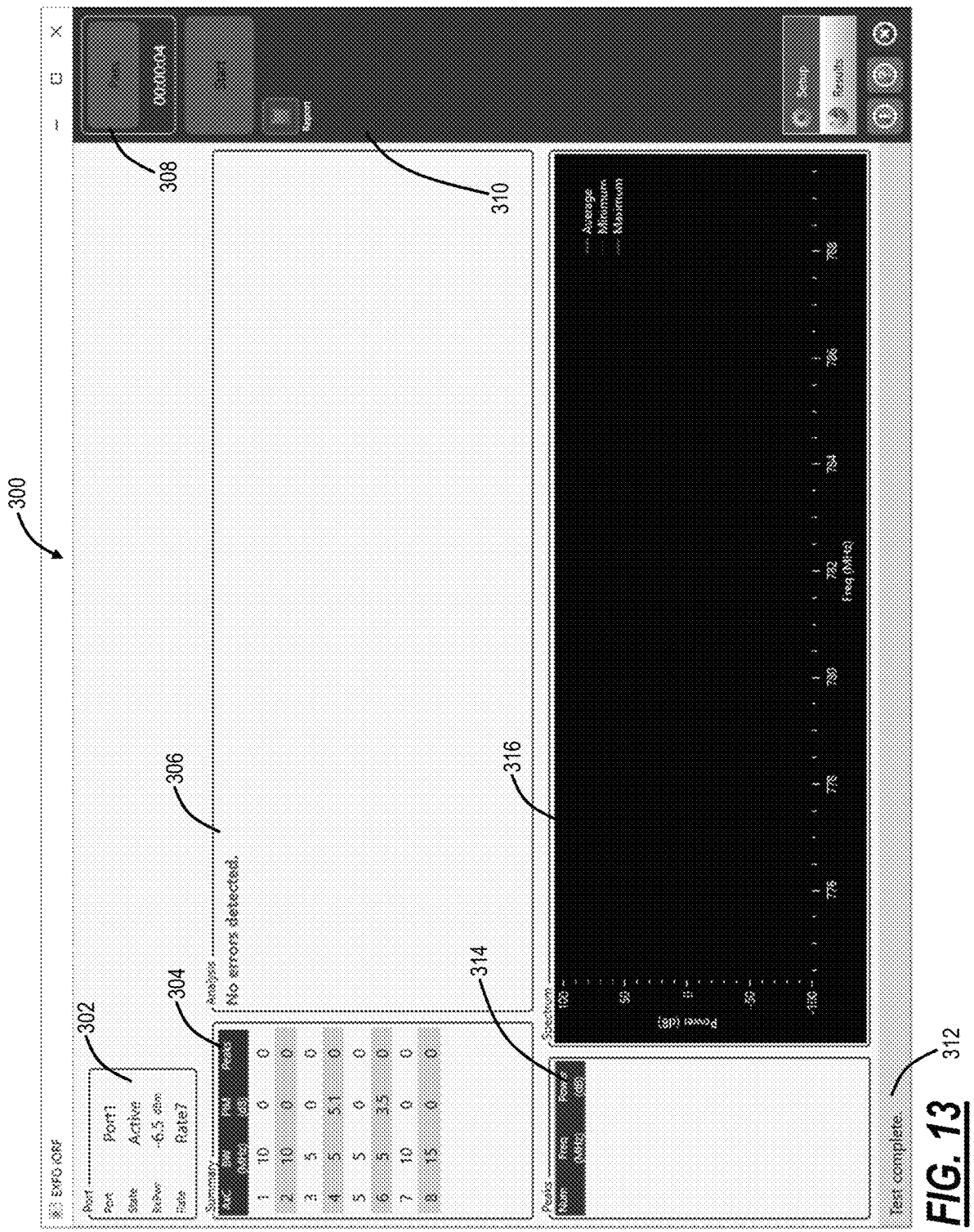
FIG. 13 is a screenshot of an example RF spectrum analysis tool in a state with no errors currently detected.
Figure 14:
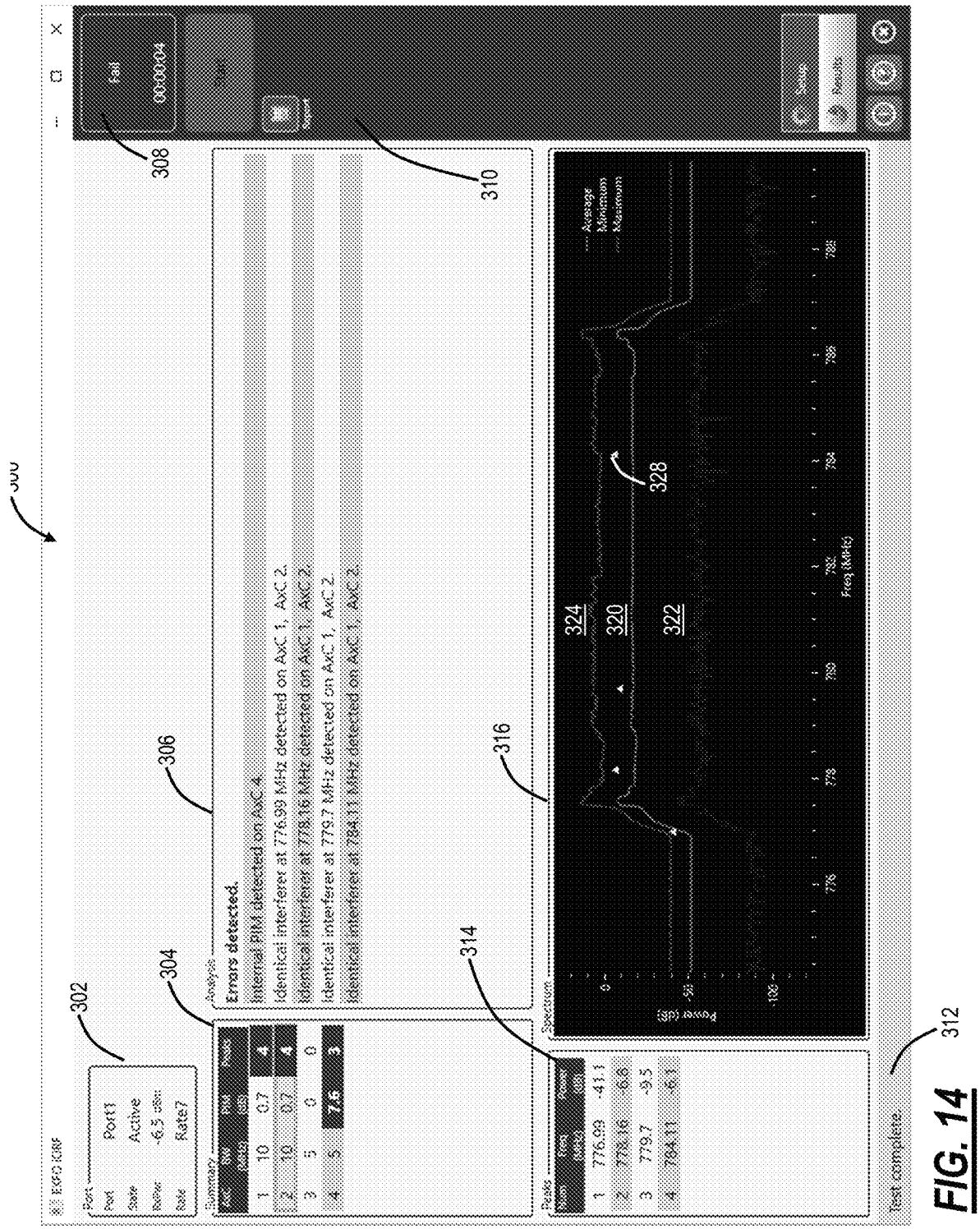
FIG. 14 is a screenshot of the example RF spectrum analysis tool in a state with a detected internal PIM and identical interferers detected on a plurality of antennas of the same tower.
Figure 15:
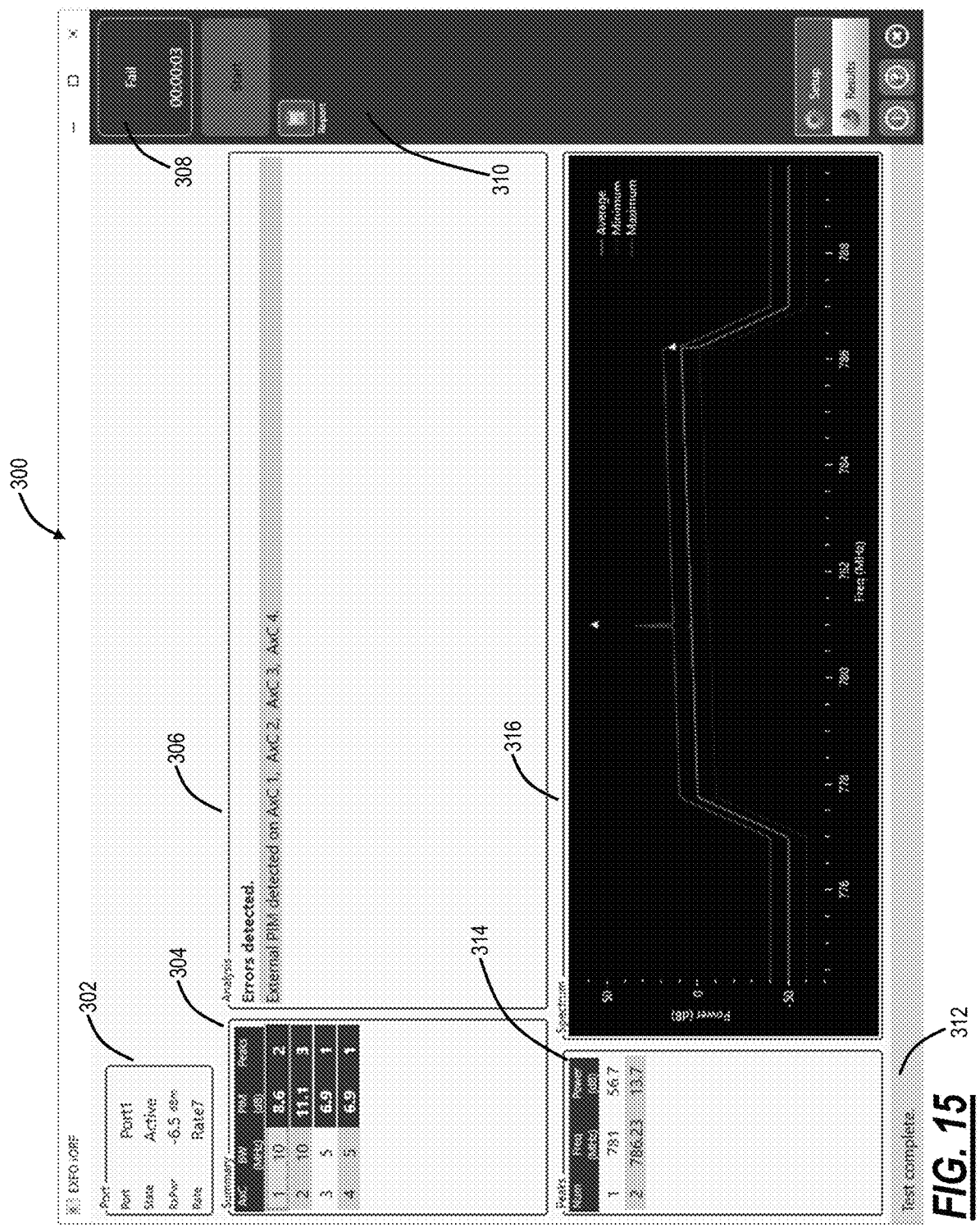
FIG. 15 is a screenshot of the example RF spectrum analysis tool in a state with a detected external PIM.
Figure 16A:
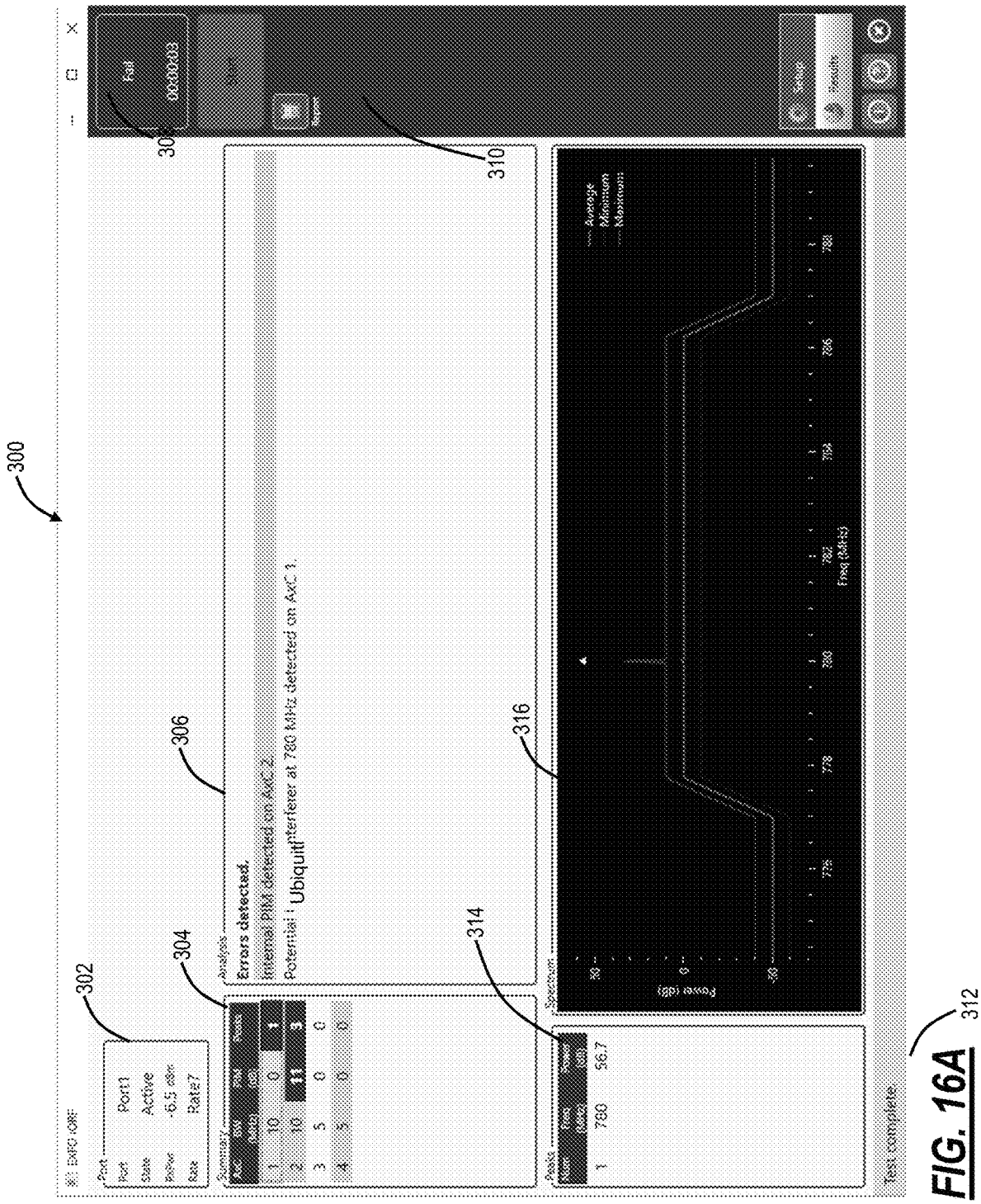
FIGS. 16A-16C are screenshots of the example RF spectrum analysis tool in a state with a detected internal PIM and a potential Wi-Fi interferer in the summary mode for AxC 1.
Figure 16B:
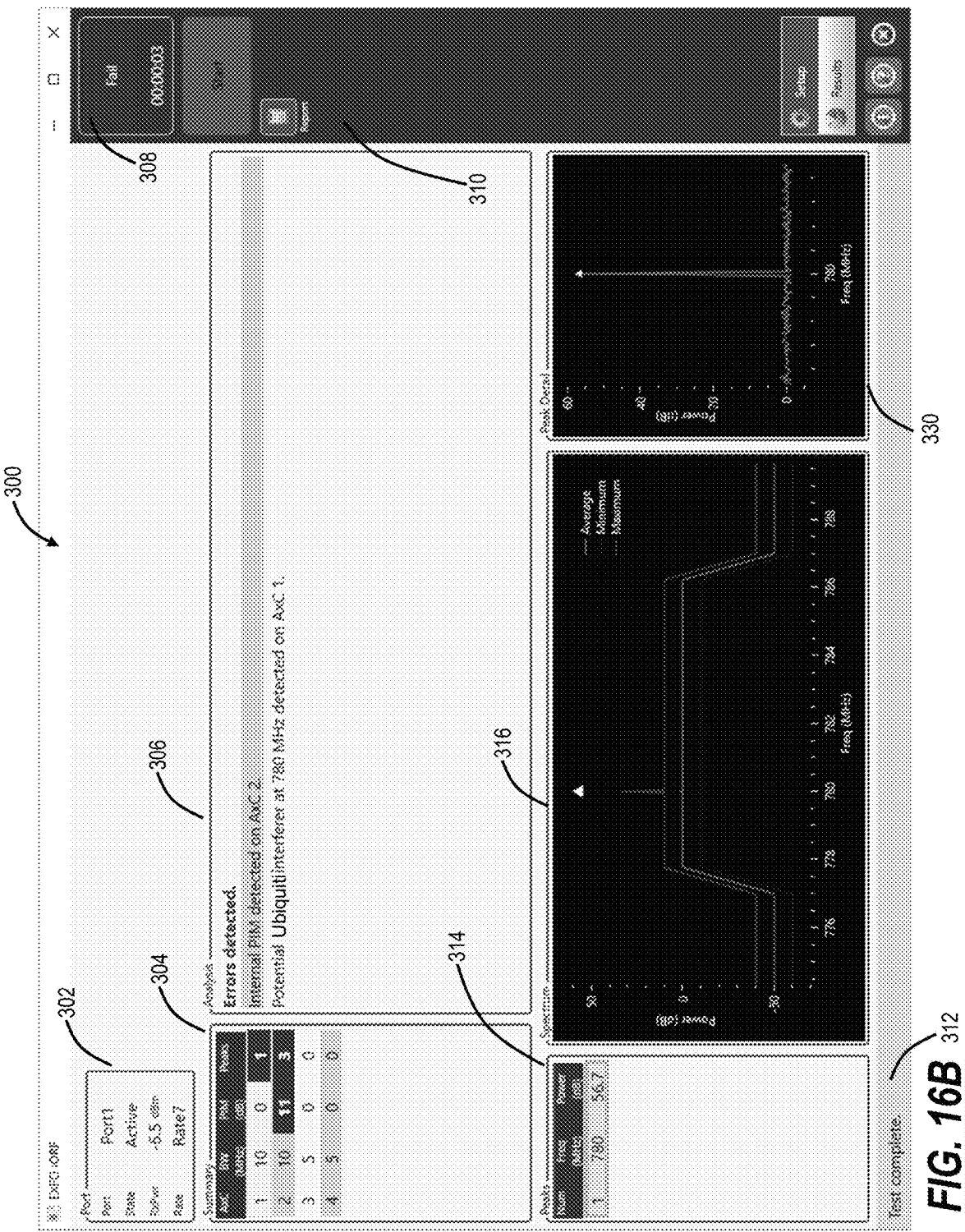
Figure 16C:
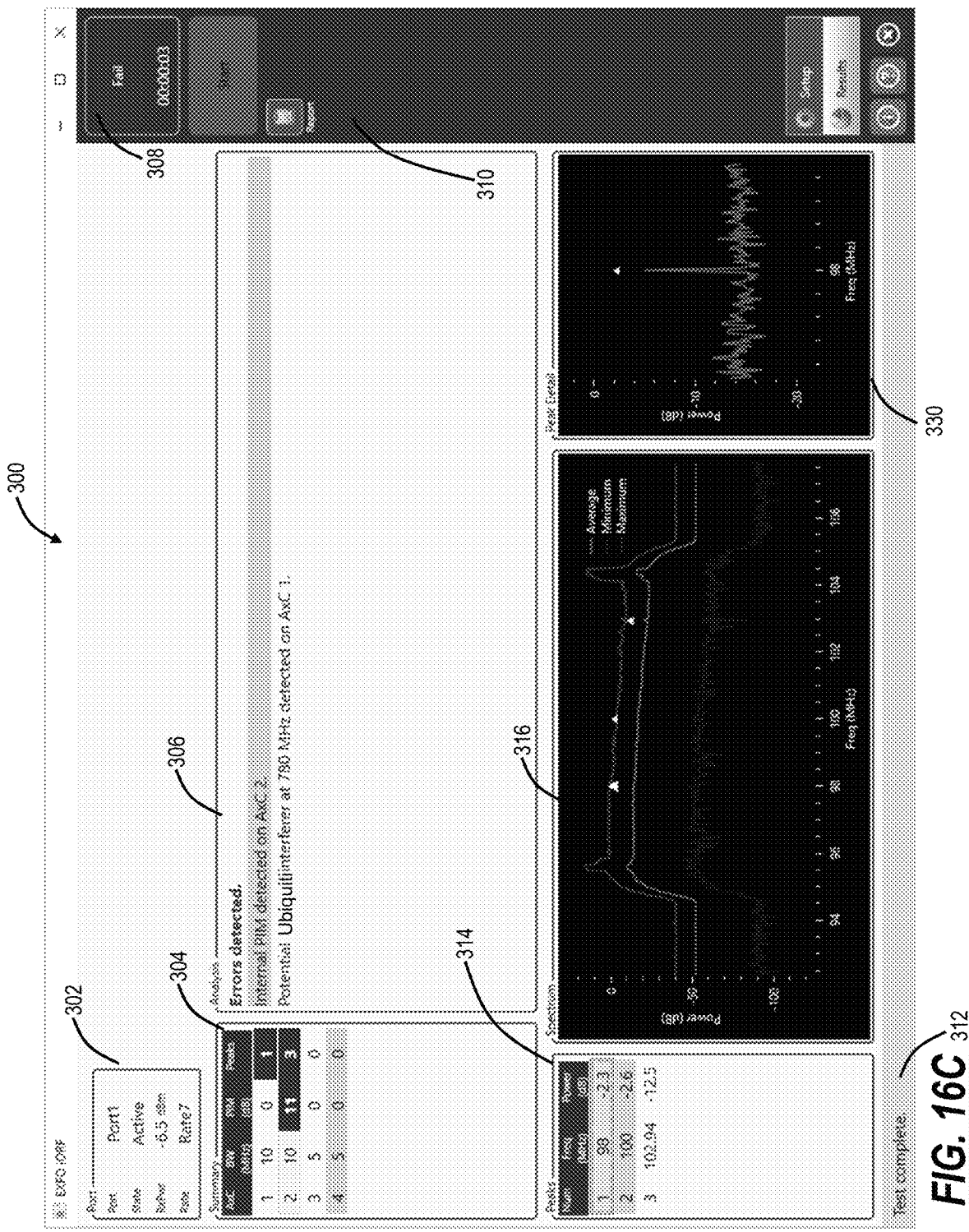
Figure 17:
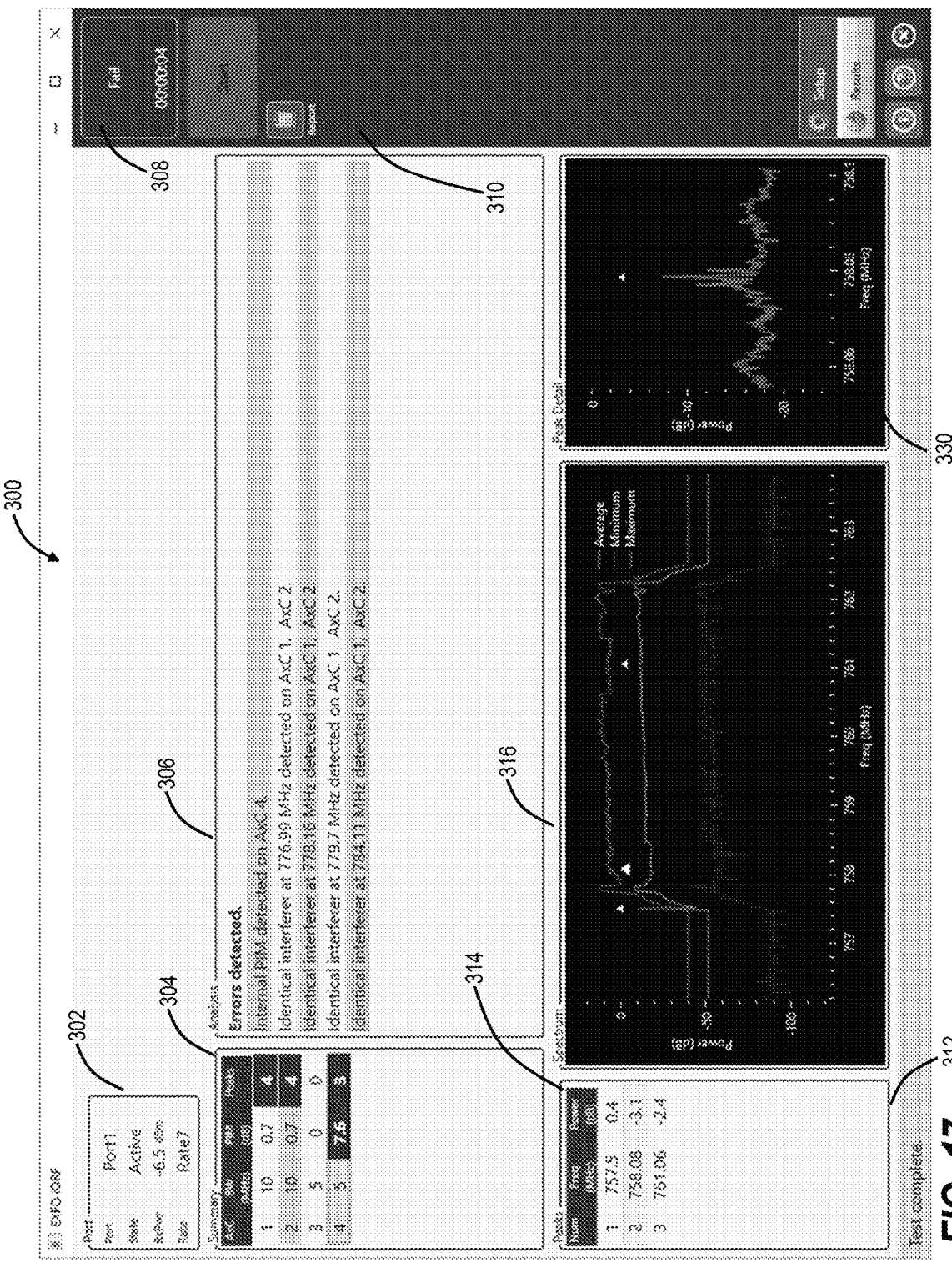
FIG. 17 is a screenshot of the example RF spectrum analysis tool in a state with a detected internal PIM on AxC 4, the RF spectrum of AxC 4 being shown in the spectrum section and for which peak 2 of AxC 4 is displayed in the peak detail.
Figure 18:
FIG. 18 is a screenshot of the example RF spectrum analysis tool with a results page.
Figure 19:
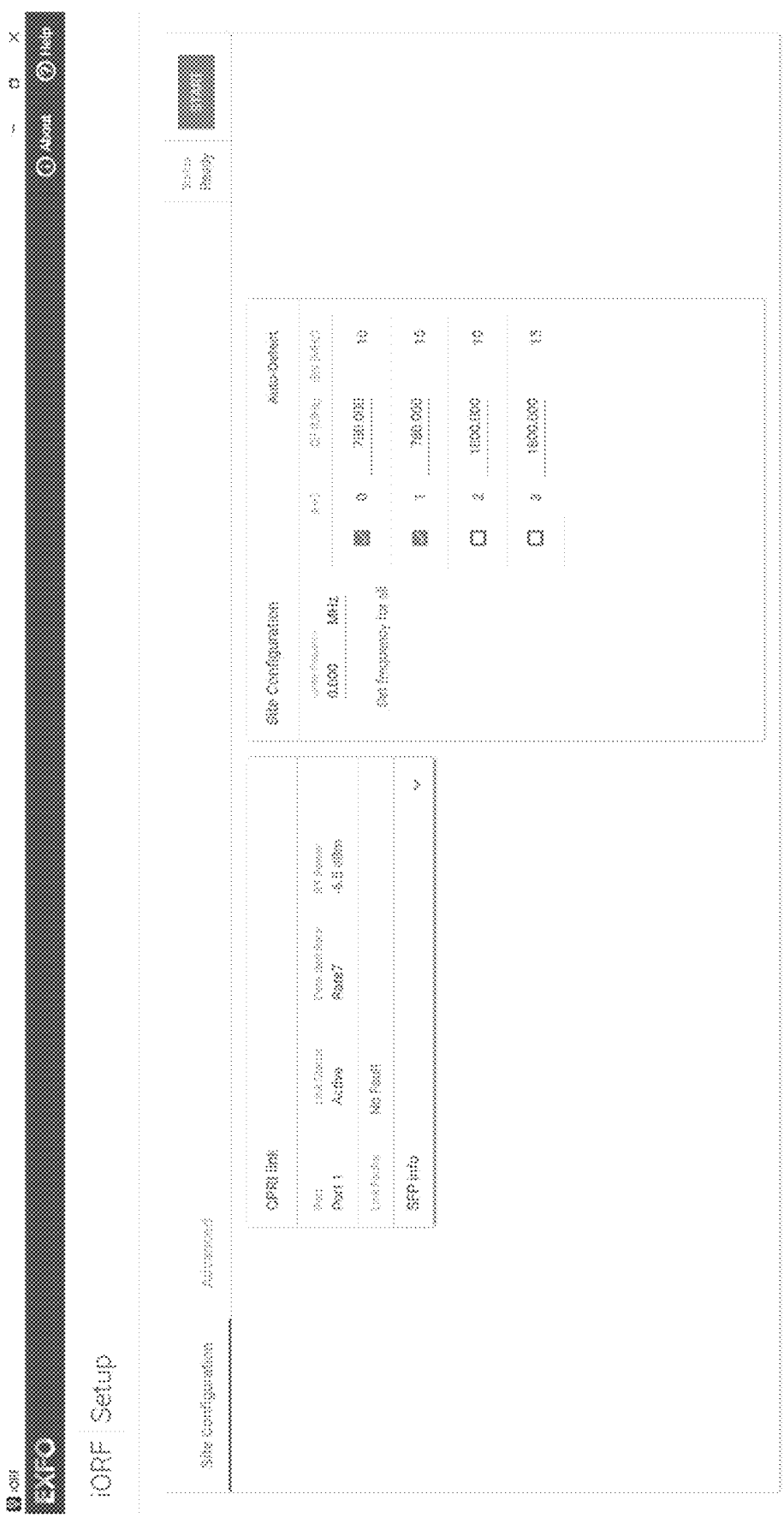
FIG. 19 is a screenshot of the example RF spectrum analysis tool and a setup page where specific AxCs are enabled/disabled in a post-analysis process.

FIGS. 13-19 are screenshots of an example UI 300 of an RF spectrum analysis tool via the test system 10 in different example states. FIG. 13 is a screenshot of an example RF spectrum analysis tool in a state with no errors currently detected. FIG. 14 is a screenshot of the example RF spectrum analysis tool in a state with a detected internal PIM and identical interferers detected on a plurality of antennas of the same tower. FIG. 15 is a screenshot of the example RF spectrum analysis tool in a state with a detected external PIM. FIGS. 16A-16C are screenshots of the example RF spectrum analysis tool in a state with a detected internal PIM and a potential Ubiquiti interferer in the summary mode for AxC 1. FIG. 17 is a screenshot of the example RF spectrum analysis tool in a state with a detected internal PIM on AxC 4, the RF spectrum of AxC 4 being shown in the spectrum section and for which peak 2 of AxC 4 is displayed in the peak detail. FIG. 18 is a screenshot of the example RF spectrum analysis tool and a setup page. FIG. 19 is a screenshot of the example RF spectrum analysis tool where specific AxCs are enabled/disabled in a post-analysis process.

The GUI 300 is similar to the GUI 100 presented herein. The GUI 300 includes various sections such as a port section 302, a summary section 304, an analysis section 306, a pass/fail state 308, a test configuration section 310, a status bar 312, a peaks section 314, and a spectrum section 316. The port section 302 displays the port identification, the port state, the port Receive Power (RxPwr), and the port rate. Other information that could be displayed about the port include the CPRI alarms, 66B Block Error, Synch Header, FAS, etc. The summary section 304 displays a table including all antennas on the link 14 and their bandwidth in MHz, their detected PIM strength in dB, and their detected peaks. The analysis section 306 displays a message related to the diagnosis made by the test system 10 about the status of the antennas. In FIG. 13, the analysis returns a "No errors detected" message.

The pass/fail state 308 displays a message related to an overall state of health of the link 14. If no errors are currently detected, the overall state is determined to be "Pass" (as in FIG. 13) and a message, typically highlighted with a color associated with success, such as green, is displayed. If at least one error is currently detected, the analysis section 306 can contain information about the potential issue and/or its cause, and the overall state will be determined to be "Fail." The "fail" message will typically be highlighted with a color associated with failure, such as red (see FIG. 14). The fail status could be subdivided in a plurality of fail sub-status depending on the severity of the detected anomalies or issues. For example, the Pass/Fail state could include 6 sub-statuses, for example, not functional, Bad, Poor, Fair, Good, Excellent. A color coding could be used to highlight the sub-status from red for not functional to green for excellent passing via shades of yellow and orange for intermediary statuses.

The test configuration section 310 includes a start button, a report button, a setup button, a results button, and tool maintenance buttons. The start button triggers the RF test on the link 14. The report button generates a report containing information about the test results, which can be automatically or manually transmitted to another user. The report may include the contents of any of the sections of the interface. In an example embodiment, the report is a Portable Document File (PDF) file containing screenshots of the appearance of the interface at the time the report button was clicked. The setup button is used to access setup parameters which can be adjusted. The results button generates the view shown in FIGS. 13-17 to view test results. The tool maintenance buttons include information about the version of the tool, contextual help, and a power off button. The status bar 312 shows a message indicating whether the RF test has completed appropriately. In FIG. 13, the status bar shows a "Test Complete" message. When the RF test is currently taking place, the status bar may show a "Test currently being performed."

FIG. 14 shows the GUI 300 in a state with a detected internal PIM and identical interferers detected on a plurality of antennas of the same tower. The pass/fail state 308 shows a Fail state. In the analysis section 306, a message indicates that at least one error has been detected. Additional messages give a diagnosis of what the issue may be. In this case, an internal PIM is detected on AxC 4. Further, identical interferers are detected on AxC 1 and AxC 2 at 776.99 MHz, 778.16 MHz, 779.7 MHz, and 784.11 MHz.

As can be seen in the summary section 304, AxC 1, and AxC 2 each have 4 detected interferers. Comparing this to the messages displayed in the analysis section 306, one can deduct that all 4 of their interferers are the same. AxC 4 has a PIM detected with a value of 7.6 dB and is the only antenna with a PIM detected with a value higher than the threshold. The PIM is, therefore, determined to be an internal PIM. It further has 3 peaks which are not identical to those of AxC 1 or AxC 2. AxC 2 is highlighted with a dashed frame and is therefore selected.

The peaks section 314 displays a table containing the identification of the peaks detected for the selected antenna, the center frequency at which they appear in MHz, and their power level in dB. Because AxC 2 is selected in the summary section 304, the peaks section 314 displays information about the peaks of AxC 2. The peaks section 314 could also include the bandwidth of the peaks.

The spectrum section 316 displays the RF spectrum graph, which was captured during the live test. On this graph, the average (middle curve 320), the minimum (bottom curve 322) and the maximum (top curve 324) traces are shown. The maximum trace is a maximum hold of all traces. The minimum trace is a minimum hold of all traces. The average trace shows the average. The location of the peaks is identified by a triangular token 328 located at the top of the peak and aligned on the center frequency of the peak. Because AxC2 is selected in the summary section 304 and no specific peak is selected in the peaks section 314, the whole RF spectrum is shown in the spectrum section 316 with all peaks of AxC 2 identified.

FIG. 15 shows the GUI 300 in an example state with a detected external PIM. The pass/fail state 308 shows a Fail state. In the analysis section 306, a message indicates that at least one error has been detected. A second message gives a diagnosis of what the issue may be, in this case, "External PIM detected on AxC 1, AxC 2, AxC 3, and AxC 4." The summary section 304 shows the values which led to this diagnosis (with highlighting) for emphasis. In this example, all four antennas have a detected PIM of at least 6 dB. The AxC 1 antenna is currently selected as is apparent from the dashed highlighting of the AxC 1 row in the table of the summary section 304.

FIG. 16A is a screenshot of the GUI 300 in a state with a detected internal PIM and a potential Ubiquiti interferer in the summary mode for AxC 1, FIG. 16B is a screenshot of the example of FIG. 16A in the peak mode for AxC 1, and FIG. 16C is a screenshot of the example of FIG. 16A in the peak mode for AxC 2 with the detail of peak 1. FIG. 16A presents a summary mode view for AxC 1, similar to that shown in FIG. 15. FIG. 16B presents a peak mode view for AxC 1 with the detail of its only peak. FIG. 16C presents a peak mode view for AxC 2 with the detail of peak 1.

In FIG. 16A, antenna AxC 1 has a detected interferer at 780 MHz. The diagnosis system, therefore, suggests that this could be caused by a Ubiquiti device in the area of the antenna. This is based on the signature database 60 and/or the known interferer detection process 260.

In FIG. 16B, peak 1 of antenna AxC 1 is selected for viewing in the peaks section 314 as is evidenced by the dashed highlighting. The peaks section 314 now appears next to the spectrum section 316. It shows a zoomed-in section 330 of the RF spectrum centered around the detected peak. A zoomed-in trace in the zoomed-in section 330 is displayed in green because it is also an average. The green trace on the full spectrum is an average of all the traces. The zoom-in trace is an average of a subset of traces, relevant to the interferer.

In FIG. 16C, peak 1 of antenna AxC 2 is selected for viewing in the peaks section 314. FIG. 16C now shows the zoomed-in section 330 of the RF spectrum around 98 MHz. The triangular token icon for peak 1 on the RF Spectrum section has a modified appearance to highlight the fact that peak 1 is being displayed in the peaks section 314.

In FIG. 17, there is a detected internal PIM on AxC 4. The RF spectrum of AxC 4 is shown in the spectrum section 316. Detected peak 2 of AxC 4 is displayed in the zoomed-in section 330. The presence of a PIM is detected by calculating the slope of the average curve in the RF spectrum.

As will be readily understood, the highlighting of rows in the tables is simply used to facilitate consultation of the tables. Odd numbered rows are shown with grey highlighting, even numbered rows are shown with different highlighting. This display scheme does not provide information about the test results.

Automated Link Analysis Process

Figure 20:
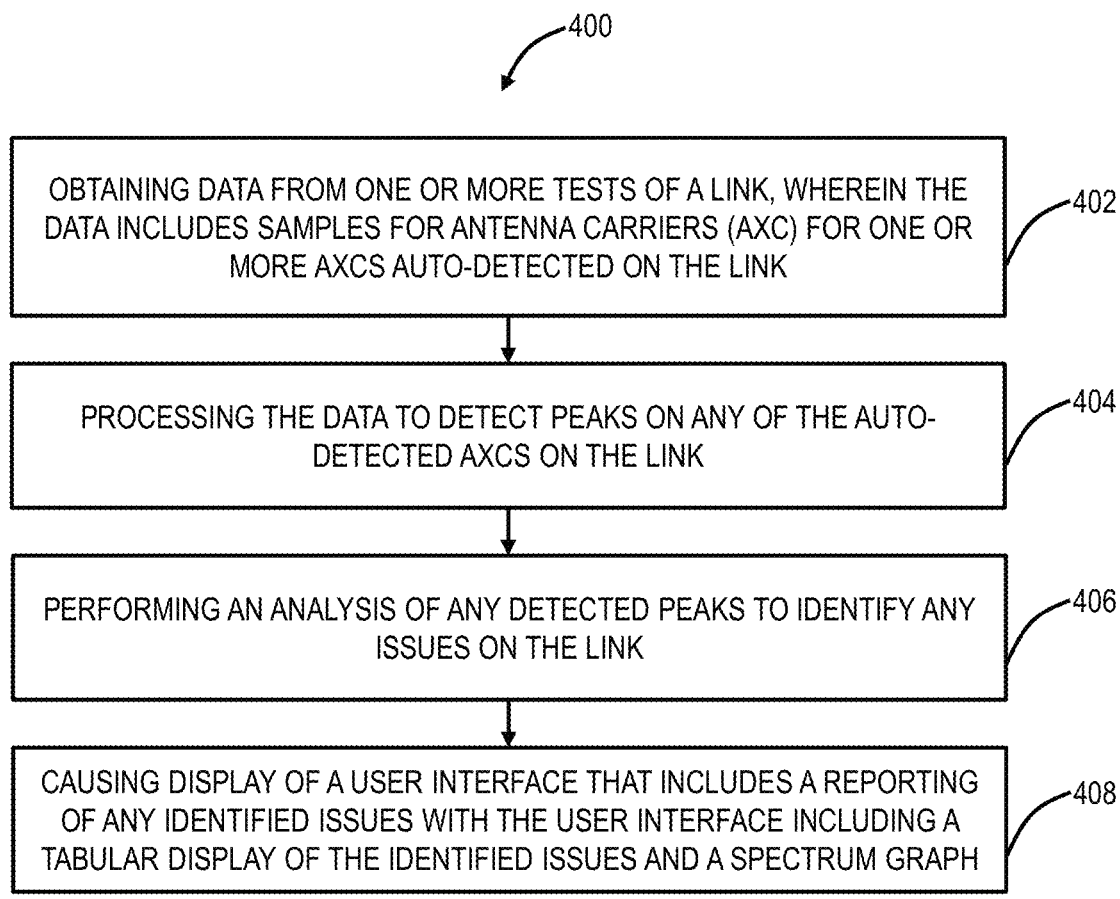
FIG. 20 is a flowchart of a process implemented by the test system or the like to automatically analyze and display results of tests of the link.

FIG. 20 is a flowchart of a process 400 implemented by the test system 10 or the like to automatically analyze and display results of tests of the link 14. The process 400 includes obtaining data from one or more tests of a link, wherein the data includes samples for Antenna Carriers (AxC) for one or more AxCs auto-detected on the link (step 402); processing the data to detect peaks on any of the auto-detected AxCs on the link (step 404); performing an analysis of any detected peaks to identify any issues on the link (step 406); and causing display of a user interface that includes a reporting of any identified issues with the user interface including a display of the identified issues and a spectrum graph (step 408). Again, the link can be a CPRI, an eCPRI, OTA capture, etc. for connectivity between between Radio Equipment Controllers (REC) and Radio Equipment (RE).

The auto-detected AxCs can be detected by the test system each time the link transitions from link down to link up, and wherein the auto-detected AxCs are maintained in an AxC list. The process 400 can further include automatically configuring Resolution Bandwidth (RBW) and Video Bandwidth (VBW) on the spectrum graph. The display can include zero or more messages with a description of each associated issue and with the zero or more messages in an automatically prioritized order. The spectrum graph can include a full graph and a zoomed-in graph, each having tokens to identify peaks in each visually. The display can include at least one message with a description of a known interferer detected in the analysis, and the known interferer can be determined based on matching signatures in a database.

The issues can include any of known interferers, internal Passive Intermodulation (PIM), external PIM, and identical interferers across all of the auto-detected AxCs. In an embodiment, the issues include known interferers detected by the steps of detecting a presence of at least one interferer at a known frequency on at least one AxC of the link; and tagging this interferer at the known frequency as being potentially caused by a known device based on matching a signature.

In another embodiment, the issues include internal Passive Intermodulation (PIM) detected by the steps of detecting the presence of a PIM in an AxC of the auto-detected AxCs of a same tower of the link; determining a level of interference of the PIM; and, if the level of interference of the PIM is greater than a PIM detection threshold and if not all of the AxCs have a PIM, determining that the internal PIM is present on corresponding AxCs. In a further embodiment, the issues include external Passive Intermodulation (PIM) detected by the steps of detecting the presence of a PIM in each AxC of the auto-detected AxCs of a same tower of the link; determining a level of interference of each PIM;

and, if the level of interference of each PIM is greater than a PIM detection threshold, determining that an external PIM is present.

In yet another embodiment, the issues include identical interferes across all of the auto-detected AxCs detected by the steps of detecting the presence of at least one interferer for at least one AxC of the auto-detected AxCs of a same tower of the link; determining a frequency of each interferer; comparing the list of interferers of each AxC with that of the other AxCs; if more than one AxC has an interferer at the same frequency, identifying that the interferers are the same; and tagging the interferer with the list of AxCs on which it appears and the frequency.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A non-transitory computer-readable storage medium having computer readable code stored thereon for programming a test system to perform the steps of:
   obtaining data from one or more tests of a link, wherein the data includes samples for Antenna Carriers (AxC) for one or more AxCs auto-detected on the link;
   processing the data to detect peaks on any of the auto-detected AxCs on the link;
   performing an analysis of any detected peaks to identify any issues on the link; and
   causing display of a user interface that includes a reporting of any identified issues with the user interface including a display of the identified issues and a spectrum graph,
   wherein the issues include identical interferers across all of the auto-detected AxCs detected by the steps of:
   detecting a presence of at least one interferer for at least one AxC of the auto-detected AxCs of a same tower of the link;
   determining a frequency of each interferer;
   comparing the list of interferers of each AxC with that of the other AxCs;
   if more than one AxC has an interferer at the same frequency, identifying that the interferers are the same; and
   tagging the interferer with the list of AxCs on which it appears and the frequency.

2. The non-transitory computer-readable storage medium of claim 1, wherein the auto-detected AxCs are detected by the test system each time the link transitions from link down to link up, and wherein the auto-detected AxCs are maintained in an AxC list.

3. The non-transitory computer-readable storage medium of claim 1, wherein the computer readable code stored thereon further programs the test system to perform the steps of:
   automatically configuring Resolution Bandwidth (RBW) and Video Bandwidth (VBW) on the spectrum graph.

4. The non-transitory computer-readable storage medium of claim 1, wherein the display includes zero or more messages with a description of each associated issue and with the zero or more messages in an automatically prioritized order.

5. The non-transitory computer-readable storage medium of claim 1, wherein the spectrum graph includes a full graph and a zoomed-in graph, each having tokens to visually identify peaks in each.

6. The non-transitory computer-readable storage medium of claim 1, wherein the display includes at least one message with a description of a known interferer detected in the analysis, and wherein the known interferer is determined based on matching signatures in a database.

7. The non-transitory computer-readable storage medium of claim 1, wherein the issues include any of known interferers, internal Passive Intermodulation (PIM), external PIM, and identical interferers across all of the auto-detected AxCs.

8. The non-transitory computer-readable storage medium of claim 1, wherein the issues include known interferers detected by the steps of:
   detecting a presence of at least one interferer at a known frequency on at least one AxC of the link; and tagging this interferer at the known frequency as being potentially caused by a known device based on matching a signature.

9. The non-transitory computer-readable storage medium of claim 1, wherein the issues include internal Passive Intermodulation (PIM) detected by the steps of:
   detecting a presence of a PIM in an AxC of the auto-detected AxCs of a same tower of the link;
   determining a level of interference of the PIM; and
   if the level of interference of the PIM is greater than a PIM detection threshold and if not all of the AxCs have a PIM, determining that the internal PIM is present on corresponding AxCs.

10. The non-transitory computer-readable storage medium of claim 1, wherein the issues include external Passive Intermodulation (PIM) detected by the steps of:
    detecting a presence of a PIM in each AxC of the auto-detected AxCs of a same tower of the link;
    determining a level of interference of each PIM; and
    if the level of interference of each PIM is greater than a PIM detection threshold, determining that an external PIM is present.

11. A test system comprising:
    a detector configured to connect to a link;
    a processor; and
    memory storing instructions that, when executed, cause the processor to
      obtain data from one or more tests of the link, wherein the data includes samples for Antenna Carriers (AxC) for one or more AxCs auto-detected on the link;
      process the data to detect peaks on any of the auto-detected AxCs on the link;
      perform an analysis of any detected peaks to identify any issues on the link; and
      cause display of a user interface that includes a reporting of any identified issues with the user interface including a display of the identified issues and a spectrum graph,
    wherein the issues include identical interferers across all of the auto-detected AxCs detected by the instructions that, when executed, cause the processor to:
      detect a presence of at least one interferer for at least one AxC of the auto-detected AxCs of a same tower of the link;
      determine a frequency of each interferer;
      compare the list of interferers of each AxC with that of the other AxCs;
      if more than one AxC has an interferer at the same frequency, identify that the interferers are the same; and
      tag the interferer with the list of AxCs on which it appears and the frequency.

12. The test system of claim 11, wherein the auto-detected AxCs are detected by the test system each time the link transitions from link down to link up, and wherein the auto-detected AxCs are maintained in an AxC list.

13. The test system of claim 11, wherein the memory storing instructions that, when executed, further cause the processor to
    automatically configure Resolution Bandwidth (RBW) and Video Bandwidth (VBW) on the spectrum graph.

14. The test system of claim 11, wherein the display includes zero or more messages with a description of each associated issue and with the zero or more messages in an automatically prioritized order.

15. The test system of claim 11, wherein the spectrum graph includes a full graph and a zoomed-in graph, each having tokens to visually identify peaks in each.

16. The test system of claim 11, wherein the display includes at least one message with a description of a known interferer detected in the analysis, and wherein the known interferer is determined based on matching signatures in a database.

17. The test system of claim 11, wherein the issues include any of known interferers, internal Passive Intermodulation (PIM), external PIM, and identical interferers across all of the auto-detected AxCs.

18. A method comprising:
    obtaining, via a test system, data from one or more tests of a link, wherein the data includes samples for Antenna Carriers (AxC) for one or more AxCs auto-detected on the link;
    processing the data to detect peaks on any of the auto-detected AxCs on the link;
    performing an analysis of any detected peaks to identify any issues on the link; and
    causing display of a user interface that includes a reporting of any identified issues with the user interface including a display of the identified issues and a spectrum graph,
    wherein the issues include identical interferers across all of the auto-detected AxCs detected by the steps of:
      detecting a presence of at least one interferer for at least one AxC of the auto-detected AxCs of a same tower of the link;
      determining a frequency of each interferer;
      comparing the list of interferers of each AxC with that of the other AxCs;
      if more than one AxC has an interferer at the same frequency, identifying that the interferers are the same; and
      tagging the interferer with the list of AxCs on which it appears and the frequency.

19. The method of claim 18, wherein the auto-detected AxCs are detected by the test system each time the link transitions from link down to link up, and wherein the auto-detected AxCs are maintained in an AxC list.

20. A non-transitory computer-readable storage medium having computer readable code stored thereon for programming a test system to perform the steps of:
    obtaining data from one or more tests of a link, wherein the data includes samples for Antenna Carriers (AxC) for one or more AxCs auto-detected on the link;
    processing the data to detect peaks on any of the auto-detected AxCs on the link;
    performing an analysis of any detected peaks to identify any issues on the link; and
    causing display of a user interface that includes a reporting of any identified issues with the user interface including a display of the identified issues and a spectrum graph,
    wherein the spectrum graph includes a full graph and a zoomed-in graph, each having tokens to visually identify peaks in each.

21. A non-transitory computer-readable storage medium having computer readable code stored thereon for programming a test system to perform the steps of:
    obtaining data from one or more tests of a link, wherein the data includes samples for Antenna Carriers (AxC) for one or more AxCs auto-detected on the link;
    processing the data to detect peaks on any of the auto-detected AxCs on the link;

performing an analysis of any detected peaks to identify any issues on the link; and causing display of a user interface that includes a reporting of any identified issues with the user interface including a display of the identified issues and a spectrum graph, wherein the issues include known interferers detected by the steps of:

detecting a presence of at least one interferer at a known frequency on at least one AxC of the link; and tagging this interferer at the known frequency as being potentially caused by a known device based on matching a signature.

22. A non-transitory computer-readable storage medium having computer readable code stored thereon for programming a test system to perform the steps of:

obtaining data from one or more tests of a link, wherein the data includes samples for Antenna Carriers (AxC) for one or more AxCs auto-detected on the link;

processing the data to detect peaks on any of the auto-detected AxCs on the link;

performing an analysis of any detected peaks to identify any issues on the link; and causing display of a user interface that includes a reporting of any identified issues with the user interface including a display of the identified issues and a spectrum graph, wherein the issues include internal Passive Intermodulation (PIM) detected by the steps of:

detecting a presence of a PIM in an AxC of the auto-detected AxCs of a same tower of the link;

determining a level of interference of the PIM;

if the level of interference of the PIM is greater than a PIM detection threshold and if not all of the AxCs have a PIM, determining that the internal PIM is present on corresponding AxCs; and if the level of interference of each PIM is greater than a PIM detection threshold, determining that an external PIM is present.

* * * * *